US010089415B2

(12) United States Patent
Grau

(10) Patent No.: US 10,089,415 B2
(45) Date of Patent: Oct. 2, 2018

(54) THREE-DIMENSIONAL COORDINATE SCANNER AND METHOD OF OPERATION

(71) Applicant: FARO Technologies, Inc., Lake Mary, FL (US)

(72) Inventor: Markus Grau, Korntal-Muenchingen (DE)

(73) Assignee: FARO TECHNOLOGIES, INC., Lake Mary, FL (US)

( * ) Notice: Subject to any disclaimer, the term of this patent is extended or adjusted under 35 U.S.C. 154(b) by 845 days.

(21) Appl. No.: 14/538,840

(22) Filed: Nov. 12, 2014

(65) Prior Publication Data

US 2015/0178412 A1 Jun. 25, 2015

Related U.S. Application Data

(60) Provisional application No. 61/918,338, filed on Dec. 19, 2013.

(51) Int. Cl.
*G06F 17/50* (2006.01)
*G01B 21/04* (2006.01)
*G01B 5/004* (2006.01)
*G01B 11/00* (2006.01)

(52) U.S. Cl.
CPC .......... *G06F 17/50* (2013.01); *G01B 5/004* (2013.01); *G01B 11/002* (2013.01); *G01B 21/047* (2013.01)

(58) Field of Classification Search
CPC ...................................... G06F 17/50
USPC ............................................. 703/1
See application file for complete search history.

(56) References Cited

U.S. PATENT DOCUMENTS

| 5,939,709 A * | 8/1999 | Ghislain ............... B82Y 20/00 250/216 |
| 6,751,344 B1 | 6/2004 | Grumbine |
| 7,194,326 B2 | 3/2007 | Cobb et al. |
| 7,246,030 B2 | 7/2007 | Raab et al. |
| RE43,895 E | 1/2013 | Crampton |
| 8,477,154 B2 | 7/2013 | Davis et al. |
| 9,041,691 B1 * | 5/2015 | Haskin ................. G06F 3/0421 345/175 |
| 9,664,508 B2 | 5/2017 | McAfee et al. |

(Continued)

OTHER PUBLICATIONS

Mark Finch, Surface Modification Tools in a Virtual Environment Interface to Scanning Probe Microscope, 1995.*

(Continued)

*Primary Examiner* — Lechi Truong
(74) *Attorney, Agent, or Firm* — Cantor Colburn LLP

(57) ABSTRACT

A system and method of determining 3D coordinates of an object is provided. The method includes determining a first set of 3D coordinates for a plurality of points on the object with a structured light scanner. An inspection plan is determined for the object, which includes features to be inspected with a remote probe. The points are mapped onto a CAD model. The features are identified on the plurality of points mapped onto a CAD model. A visible light is projected with the scanner proximate a first feature of the features. A sensor is contacted on the remote probe to at least one first point on the first feature on the object. A first position and orientation of the remote probe are determined with the scanner. A second set of 3D coordinates of the at least one first point are determined on the first feature on the object.

22 Claims, 19 Drawing Sheets

(56) References Cited

U.S. PATENT DOCUMENTS

| | | |
|---|---|---|
| 2006/0235611 A1 | 10/2006 | Deaton et al. |
| 2009/0123045 A1* | 5/2009 | Quadling ................ G06T 15/04 |
| | | 382/128 |
| 2011/0123097 A1 | 5/2011 | Van Coppenolle |
| 2012/0281087 A1* | 11/2012 | Kruse .................... G01B 11/25 |
| | | 348/136 |
| 2013/0083964 A1 | 4/2013 | Morris et al. |
| 2013/0197852 A1 | 8/2013 | Grau et al. |
| 2013/0293684 A1 | 11/2013 | Becker et al. |

OTHER PUBLICATIONS

DLP-Based Structured Light 3D Imaging Technologies and Applications by Jason Geng published in the Proceedings of SPIE, vol. 7932. Published Feb. 11, 2011, 15 pages.

Notification of Transmittal of the International Search Report and the Written Opinion of the International Searching Authority, or the Declaration; PCT/US2014/065449; dated Feb. 20, 2015.

Stone, et al. "Automated Part Tracking on the Construction Job Site" 8 pp; XP55055816A; National Institute of Standards and Technology.

* cited by examiner

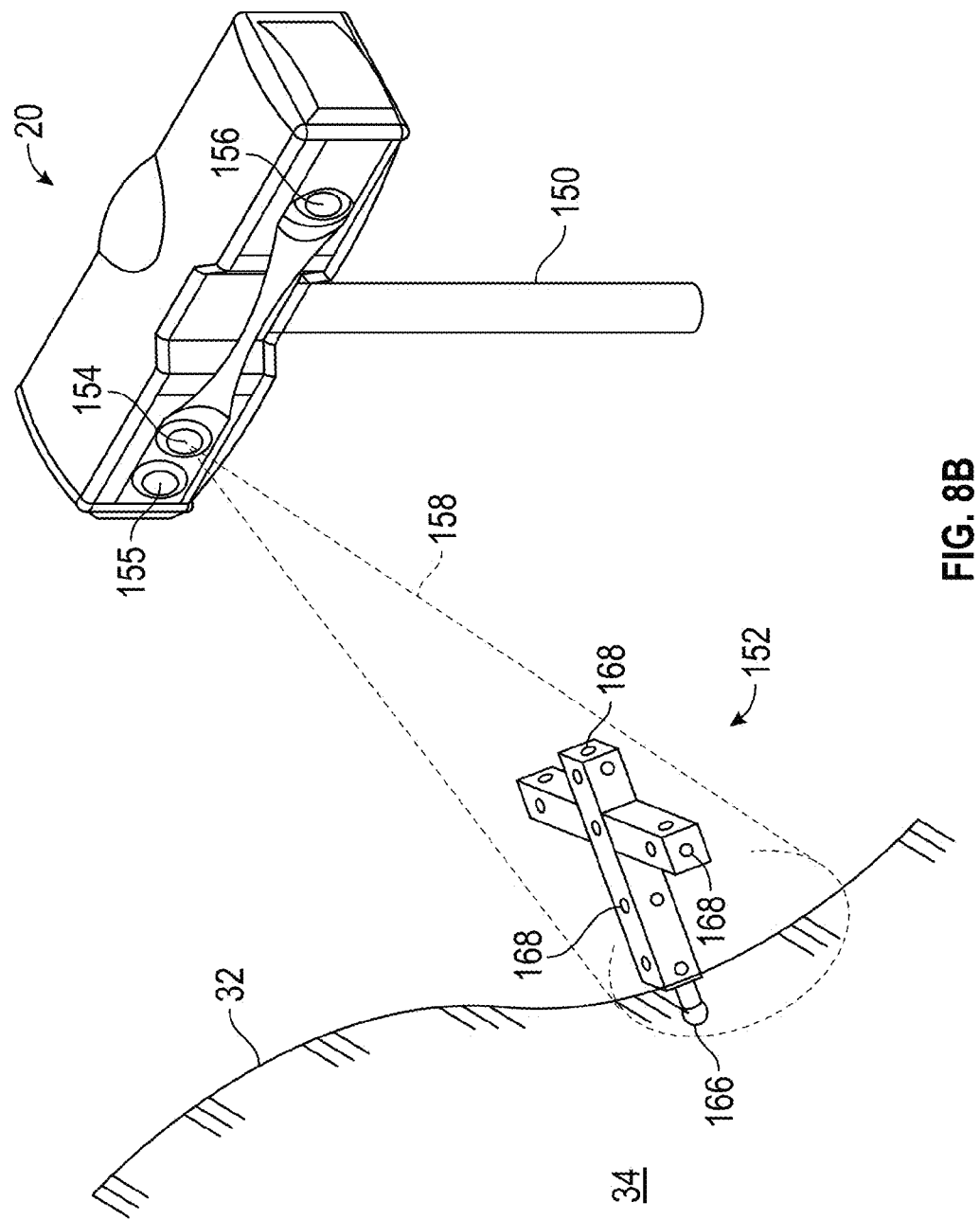

THREE-DIMENSIONAL COORDINATE SCANNER AND METHOD OF OPERATION

CROSS-REFERENCE TO RELATED APPLICATIONS

The present application is a nonprovisional application of U.S. Provisional Application No. 61/918,338 filed on Dec. 19, 2013, the contents of which is incorporated by reference herein in its entirety.

BACKGROUND OF THE INVENTION

The subject matter disclosed herein relates to a three-dimensional coordinate scanner and in particular to a triangulation-type scanner having multiple modalities of data acquisition.

The acquisition of three-dimensional coordinates of an object or an environment is known. Various techniques may be used, such as time-of-flight or triangulation methods for example. A time-of-flight systems such as a laser tracker, total station, or time-of-flight scanner may direct a beam of light such as a laser beam toward a retroreflector target or a spot on the surface of the object. An absolute distance meter is used to determine the distance to the target or spot based on length of time it takes the light to travel to the target or spot and return. By moving the laser beam or the target over the surface of the object, the coordinates of the object may be ascertained. Time-of-flight systems have advantages in having relatively high accuracy, but in some cases may be slower than some other systems since time-of-flight systems must usually measure each point on the surface individually.

In contrast, a scanner that uses triangulation to measure three-dimensional coordinates projects onto a surface either a pattern of light in a line (e.g. a laser line from a laser line probe) or a pattern of light covering an area (e.g. structured light) onto the surface. A camera is coupled to the projector in a fixed relationship, for example, by attaching the camera and the projector to a common frame. The light emitted from the projector is reflected off of the surface and detected by the camera. Since the camera and projector are arranged in a fixed relationship, the distance to the object may be determined using trigonometric principles. Compared to coordinate measurement devices that use tactile probes, triangulation systems provide advantages in quickly acquiring coordinate data over a large area. In this document, the resulting collection of three-dimensional coordinate values provided by the triangulation system is referred to as point cloud data or simply a point cloud.

A number of issues may interfere with the acquisition of high accuracy point cloud data when using a laser scanner. These may arise during scanning include but are not limited to: variations in the level of light received over the camera image plane as a result of variations in reflectance of the object surface or variations in the angle of incidence of the surface relative to the projected light; low resolution near edges such as the edges of holes; and multipath interference for example. In some cases, the operator may be unaware of or unable to eliminate these scanning anomalies. In these cases, missing or faulty point cloud data is the result.

Accordingly, while existing scanners are suitable for their intended purpose the need for improvement remains, particularly in providing a scanner that can adapt to undesirable conditions and provide improved data point acquisition.

BRIEF DESCRIPTION OF THE INVENTION

According to one aspect of the invention, a method of determining three dimensional coordinates of an object is provided. The method comprising: determining a first set of three dimensional coordinates for a plurality of points on the object with a scanner device, the scanner device being configured to emit and receive a structured light for determining the first set of three dimensional coordinates of points on a surface; accessing with a processor an inspection plan for the object, the inspection plan including a plurality of features to be inspected with a remote probe; mapping with the processor the plurality of points onto a computer aided design model; associating with the processor the plurality of features with the plurality of points mapped onto a computer aided design model; projecting a visible light with the scanner device proximate a first feature of the plurality of features; contacting a sensor on the remote probe to at least one first point on the first feature on the object; determining a first position and orientation of the remote probe with the scanner device, the remote projecting having a plurality of illuminated lights, the plurality of illuminated lights having at least three non-collinear illuminated lights; and determining with the scanner device a second set of three dimensional coordinates of the at least one first point on the first feature on the object.

According to one aspect of the invention, a method of determining three dimensional coordinates of an object is provided. The method comprising: providing a scanning device having a projector having a light source, the projector configured to emit a structured light onto the object, the structured light including at least three non-collinear pattern elements, the scanning device further having an image sensor arranged to receive the structured light reflected from the object; providing a movable remote probe having a touch sensor on one end and a plurality of illuminated lights disposed thereon, the plurality of illuminated lights having at least three non-collinear illuminated lights, the remote probe being configured to transmit a signal in response to the touch sensor contacting the object; projecting a first structured light onto the object with the projector; receiving the first structured light reflected from the object with the image sensor; determining with the scanning device a first set of three dimensional coordinates from the first structured light reflected from the object; mapping with a processor the first set of three dimensional coordinates onto a computer aided design model of the object; associating at least one feature of the object with the first set of three dimensional coordinates mapped onto the computer aided design model of the object; retrieving with the processor an inspection plan for the object, the inspection plan including the at least one feature, wherein the step of associating the at least one feature includes determining the feature from the inspection plan; and projecting the visible light onto the object proximate a location of the at least one feature with the projector.

According to yet another aspect of the invention, a noncontact optical three-dimensional measuring device is provided. The device including a projector having a light source, the projector configured to emit a structured light onto an object, the structured light including at least three non-collinear pattern elements. An image sensor is arranged in a fixed relationship with the projector and arranged to receive the structured light reflected from the object. A movable remote probe is provided having a touch sensor on one end and a plurality of illuminated lights disposed thereon, the plurality of illuminated lights having at least three non-collinear illuminated lights, the remote probe being configured to transmit a signal in response to the touch sensor contacting the object, wherein the image sensor is further arranged to receive light reflected from the plurality of illuminated lights. A processor having memory is provided, the processor being electrically coupled to the projector and the image sensor, the processor is configured to access an inspection plan from the memory, the processor further being configured to project a second light with the projector and receive the second light reflected off of the object with the image sensor, the processor further configured to determining a first set of three dimensional coordinates of points on the object based at least in part on the second light being received by the image sensor. A processing device is coupled for communication to the processor, the processing device being configured to receive a computer aided design model of the object and the first set of three dimensional coordinates, the processing device being configured to map the first set of three dimensional coordinates onto the computer aided design model in response to receiving the first set of three dimensional coordinates.

These and other advantages and features will become more apparent from the following description taken in conjunction with the drawings.

BRIEF DESCRIPTION OF THE DRAWING

The subject matter, which is regarded as the invention, is particularly pointed out and distinctly claimed in the claims at the conclusion of the specification. The foregoing and other features, and advantages of the invention are apparent from the following detailed description taken in conjunction with the accompanying drawings in which:

FIGS. 8A and 8B are perspective views of a scanner used in conjunction with a remote probe device in accordance with an embodiment of the invention;

Figure 1:
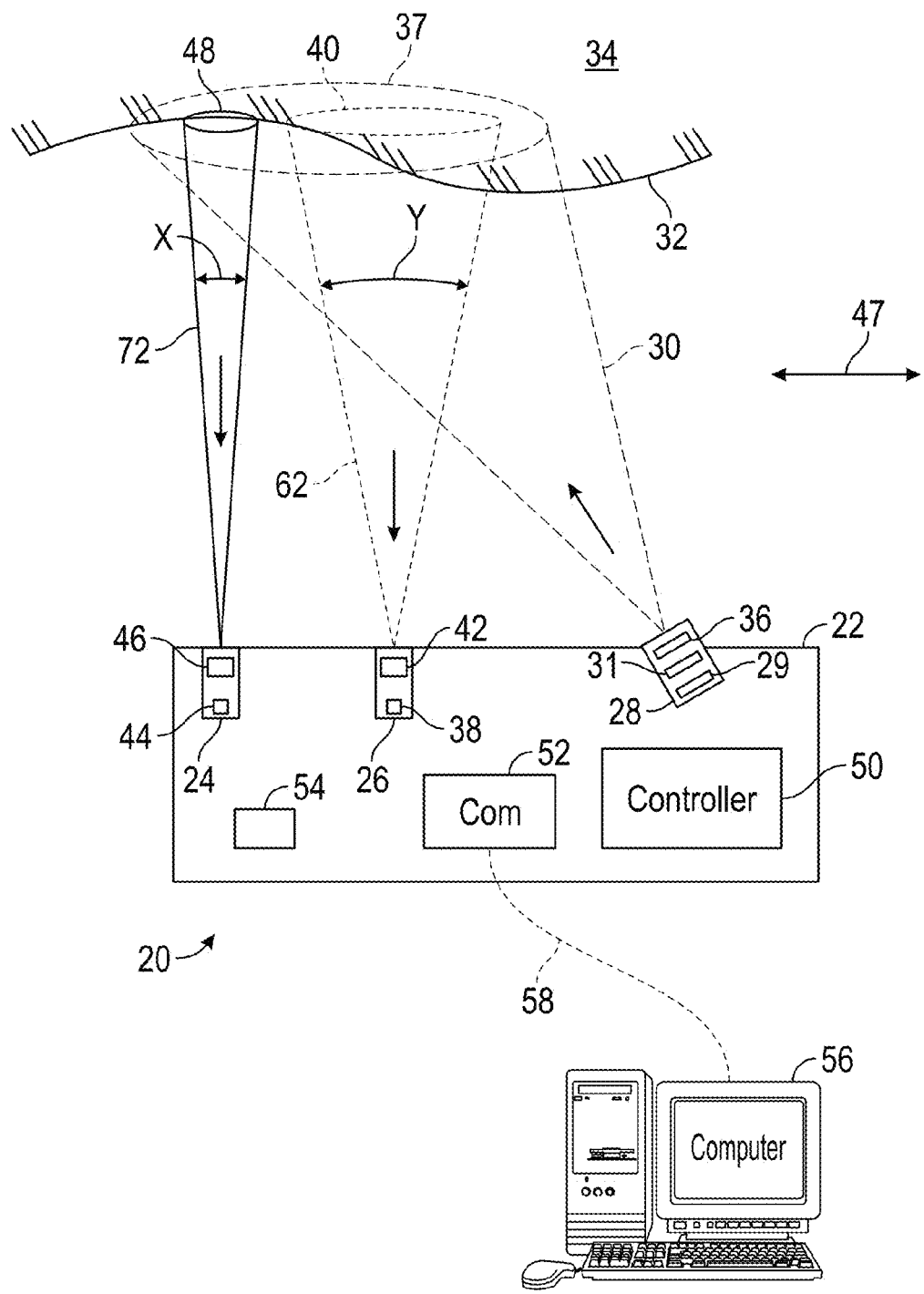
FIG. 1 is a top schematic view of a scanner in accordance with an embodiment of the invention.

The detailed description explains embodiments of the invention, together with advantages and features, by way of example with reference to the drawings.

DETAILED DESCRIPTION OF THE INVENTION

Embodiments of the present invention provide advantages increasing the reliability and accuracy of three-dimensional coordinates of a data point cloud acquired by a scanner. Embodiments of the invention provide advantages in detecting anomalies in acquired data and in response automatically adjusting the operation of the scanner to acquire the desired results. Embodiments of the invention provide advantages in detecting anomalies in the acquired data and in response providing indication to the operator of areas where additional data acquisition is needed. Still further embodiments of the invention provide advantages in detecting anomalies in the acquired data and in response providing indication to the operator where additional data acquisition may be acquired with a remote probe.

Scanner devices acquire three-dimensional coordinate data of objects. In one embodiment, a scanner 20 shown in FIG. 1 has a housing 22 that includes a first camera 24, a second camera 26 and a projector 28. The projector 28 emits light 30 onto a surface 32 of an object 34. In the exemplary embodiment, the projector 28 uses a visible light source 29 that illuminates a pattern generator 31. The visible light source may be a laser, a superluminescent diode, an incandescent light, a Xenon lamp, a light emitting diode (LED), or other light emitting device for example. In another embodiment, the light source may project infrared light, for example, light at 850 nm or 1550 nm. In one embodiment, the pattern generator is a chrome-on-glass slide having a structured light pattern etched thereon. The slide may have a single pattern or multiple patterns that move in and out of position as needed. The slide may be manually or automatically installed in the operating position. In other embodiments, the source pattern may be light reflected off or transmitted by a digital micro-mirror device (DMD) such as a digital light projector (DLP) manufactured by Texas Instruments Corporation, a liquid crystal device (LCD), a liquid crystal on silicon (LCOS) device, or a similar device used in transmission mode rather than reflection mode. The projector 28 may further include a lens system 36 that alters the outgoing light to cover the desired area and that brings the projected pattern into "focus" (into an image that is relatively clear rather than fuzzy) on the surface 32.

In an embodiment, the projector 28 is configurable to emit a structured light over an area 37. As used herein, the term "structured light" refers to a two-dimensional pattern of light projected onto an area of an object that conveys information which may be used to determine coordinates of points on the object. To cover an area, as opposed to a line, a structured light pattern will contain at least three non-collinear pattern elements disposed within the area. Each of the three non-collinear pattern elements conveys information which may be used to determine the point coordinates on the surface of the object being scanned. In another embodiment, a projector is provided that is configurable to project both an area pattern as well as a line pattern. In one embodiment, the projector is a digital micromirror device (DMD), which is configured to switch back and forth between the two. In one embodiment, the DMD projector may also sweep a point in a raster pattern or sweep a line. Such a DMD projector may also change the direction of the scan pattern of the line or swept point.

In general, there are two types of structured light patterns, a coded light pattern and an uncoded light pattern. As the term is used herein a coded light pattern is one in which the three dimensional coordinates of an illuminated surface of the object are found by acquiring a single image. With a coded light pattern, it is possible to obtain and register point cloud data while the projecting device is moving relative to the object. One type of coded light pattern contains a set of elements (e.g. geometric shapes) arranged in lines where at least three of the elements are non-collinear.

In contrast, an uncoded structured light pattern, as the term is used herein, is a pattern that does not in general allow 3D coordinates to be determined by measuring a single pattern. Instead, 3D coordinates may be found using a series of uncoded light patterns projected and imaged sequentially. For this case, it is usually necessary to hold the projector fixed relative to the object.

It should be appreciated that the scanner 20 may use either coded or uncoded structured light patterns. The structured light pattern may include the patterns disclosed in the journal article "DLP-Based Structured Light 3D Imaging Technologies and Applications" by Jason Geng published in the Proceedings of SPIE, Vol. 7932, which is incorporated herein by reference. In addition, in some embodiments described herein below, the projector 28 transmits a pattern formed a swept line of light or a swept point of light. Swept lines and points of light provide advantages over areas of light in identifying some types of anomalies such as multi-path interference. Sweeping the line automatically while the scanner is held stationary also has advantages in providing a more uniform sampling of surface points.

The first camera 24 includes a photosensitive sensor 44 which generates a digital image/representation of the area 48 within the sensor's field of view. The sensor may be charged-coupled device (CCD) type sensor or a complementary metal-oxide-semiconductor (CMOS) type sensor for example having an array of pixels. The first camera 24 may further include other components, such as but not limited to lens 46 and other optical devices such as optical filters, for example. The lens 46 has an associated first focal length. The sensor 44 and lens 46 cooperate to define a first field of view "X". In the exemplary embodiment, the first field of view "X" is 16 degrees (0.28 inch per inch).

Similarly, the second camera 26 includes a photosensitive sensor 38 which generates a digital image/representation of the area 40 within the sensor's field of view. The sensor may be a device having an array of pixels, for example, a charge-coupled device (CCD) type sensor or a complementary metal-oxide-semiconductor (CMOS) type sensor. The second camera 26 may further include other components, such as but not limited to lens 42. The lens 42 has an associated second focal length, the second focal length being different than the first focal length. The sensor 38 and lens 42 cooperate to define a second field of view "Y". In the exemplary embodiment, the second field of view "Y" is 50 degrees (0.85 inch per inch). The second field of view Y is larger than the first field of view X. Similarly, the area 40 is larger than the area 48. It should be appreciated that a larger field of view allows a given region of the object surface 32 to be measured faster; however, if the photosensitive arrays 44 and 38 have the same number of pixels, a smaller field of view will provide higher resolution.

In the exemplary embodiment, the projector 28 and the first camera 24 are arranged in a fixed relationship at an angle such that the sensor 44 may receive light reflected from the surface 32 of the object 34. Similarly, the projector 28 and the second camera 26 are arranged in a fixed relationship at an angle such that the sensor 38 may receive light reflected from the surface 32 of object 34. Since the projector 28, first camera 24 and second camera 26 have fixed geometric relationships, the 3D coordinates of points on the surface may be determined by their trigonometric relationships. Although the surface areas 48 and 40 of the cameras 24 and 26, respectively, are shown not to overlap in FIG. 1, in embodiments, the areas may partially overlap or totally overlap.

The projector 28 and cameras 24, 26 are electrically coupled to a controller 50 disposed within the housing 22. The controller 50 may include one or more microprocessors, digital signal processors, memory and signal conditioning circuits. The scanner 20 may further include actuators (not shown) which may be manually activated by the operator to initiate operation and data capture by the scanner 20. In one embodiment, the controller 50 performs image processing to determine the X, Y, Z coordinate data (point cloud data) of the surface 32 of object 34. The coordinate data may be stored locally such as in a volatile or nonvolatile memory 54 for example. The memory may be removable, such as a flash drive or a memory card for example. In other embodiments, the scanner 20 has a communications circuit 52 that allows the scanner 20 to transmit the coordinate data to a remote processing system 56. The communications medium 58 between the scanner 20 and the remote processing system 56 may be wired (e.g. Ethernet) or wireless (e.g. Bluetooth, IEEE 802.11). In one embodiment, the coordinate data is determined by the remote processing system 56 based on acquired images transmitted by the scanner 20 over the communications medium 58.

A relative motion is possible between the object surface 32 and the scanner 20, as indicated by the bidirectional arrow 47. There are several ways in which such relative motion may be provided. In an embodiment, the scanner is a handheld scanner and the object 34 is fixed. Relative motion is provided by moving the scanner over the object surface. In another embodiment, the scanner is attached to a robotic end effector. Relative motion is provided by the robot as it moves the scanner over the object surface. In another embodiment, either the scanner 20 or the object 34 is attached to a moving mechanical mechanism, for example, a gantry coordinate measurement machine or an articulated arm CMM. Relative motion is provided by the moving mechanical mechanism as it moves the scanner 20 over the object surface. In some embodiments, motion is provided by the action of an operator and in other embodiments, motion is provided by a mechanism that is under computer control.

Figure 2:
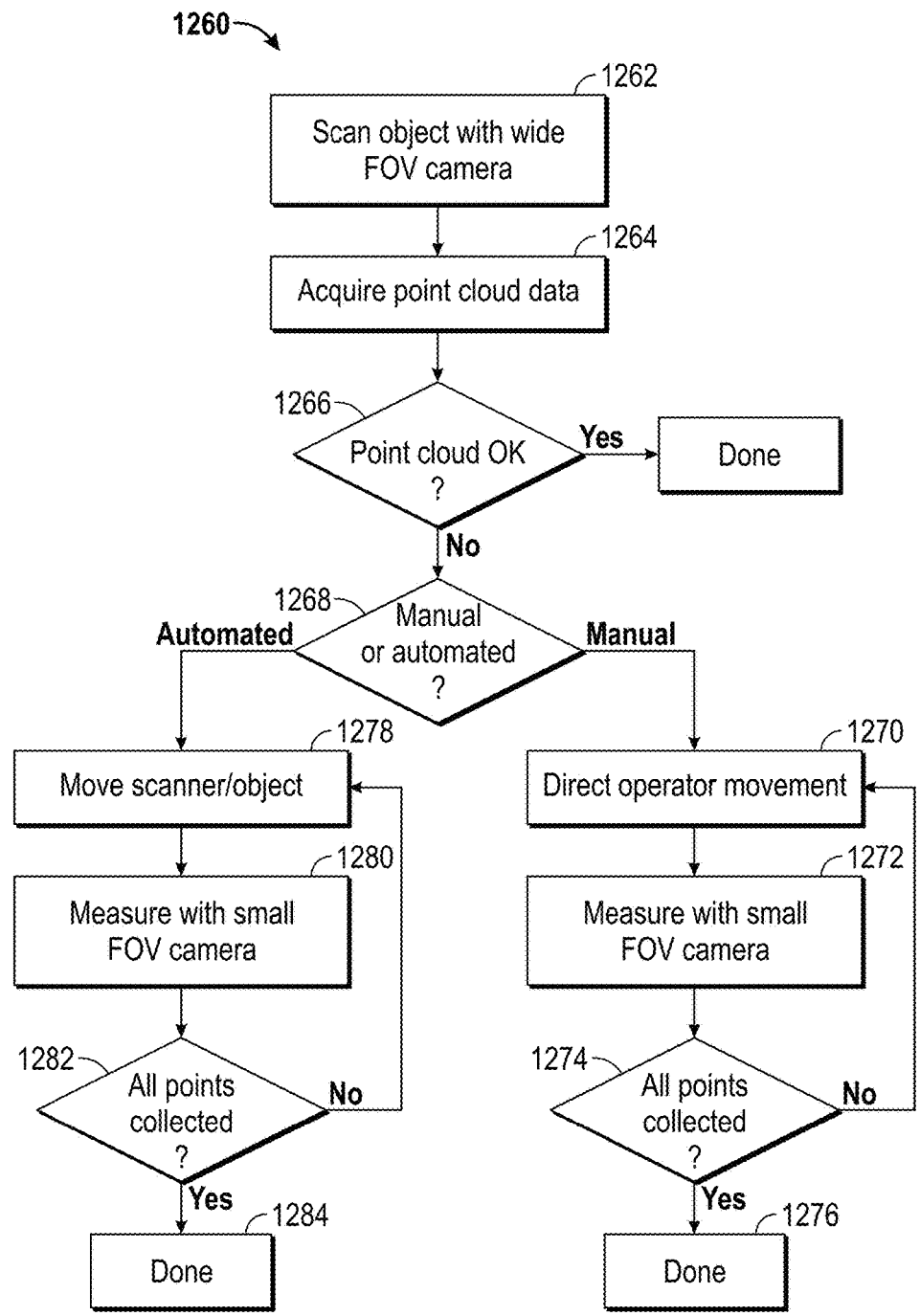
FIG. 2 is a flow chart showing a method of operating the scanner of FIG. 1.

Referring now to FIG. 2, the operation of the scanner 20 according to a method 1260 is described. As shown in block 1262, the projector 28 first emits a structured light pattern onto the area 37 of surface 32 of the object 34. The light 30 from projector 28 is reflected from the surface 32 as reflected light 62 received by the second camera 26. The three-dimensional profile of the surface 32 affects the image of the pattern captured by the photosensitive array 38 within the second camera 26. Using information collected from one or more images of the pattern or patterns, the controller 50 or the remote processing system 56 determines a one to one correspondence between the pixels of the photosensitive array 38 and pattern of light emitted by the projector 28. Using this one-to-one correspondence, triangulation principals are used to determine the three-dimensional coordinates of points on the surface 32. This acquisition of three-dimensional coordinate data (point cloud data) is shown in block 1264. By moving the scanner 20 over the surface 32, a point cloud may be created of the entire object 34.

During the scanning process, the controller 50 or remote processing system 56 may detect an undesirable condition or problem in the point cloud data, as shown in block 1266. Methods for detecting such a problem are discussed hereinbelow with regard to FIG. 12. The detected problem may be an error in or absence of point cloud data in a particular area for example. This error in or absence of point cloud data may be caused by too little or too much light reflected from a portion of an object surface. Too little or too much reflected light may result from a difference in reflectance over the object surface, for example, as a result of high or variable angles of incidence of the light 30 on the object surface 32 or as a result of low reflectance (black or transparent) materials or shiny surfaces. Certain points on the object may be angled in such a way as to produce a very bright specular reflectance known as a glint.

Another possible reason for an error in or absence of point cloud data is a lack of resolution in regions having fine features, sharp edges, or rapid changes in depth. Such lack of resolution may result in measuring a hole or a straight edge, for example.

Another possible reason for an error in or absence of point cloud data is multipath interference. Ordinarily a ray of light from the projector 28 strikes a point on the surface 32 and is scattered over a range of angles. The scattered light is imaged by the lens 42 of camera 26 onto a small spot on the photosensitive array 38. Similarly, the scattered light may be imaged by the lens 46 of camera 24 onto a small spot on the photosensitive array 44. Multipath interference occurs when the light reaching the point on the surface 32 does not come only from the ray of light from the projector 28 but, in addition, from secondary light reflected off another portion of the surface 32. Such secondary light may compromise the pattern of light received by the photosensitive array 44, thereby preventing accurate determination of three-dimensional coordinates of the point. Methods for identifying the presence of multipath interference are described in the present application with regard to FIG. 12.

If in block 1266 the controller determines that the point cloud is all right, the procedure is finished. Otherwise, a determination is made in block 1268 of whether the scanner is used in a manual or automated mode. If the mode is manual, the operator is directed in block 1270 to move the scanner into the desired position.

There are many ways that the movement desired by the operator may be indicated. In an embodiment, indicator lights on the scanner body indicate the desired direction of movement. In another embodiment, a light is projected onto the surface indicating the direction over which the operator is to move. In addition, a color of the projected light may indicate whether the scanner is too close or too far from the object. In another embodiment, an indication is made on display of the region to which the operator is to project the light. Such a display may be a graphical representation of point cloud data, a CAD model, or a combination of the two. The display may be presented on a computer monitor or on a display built into the scanning device.

In any of these embodiments, a method of determining the approximate position of the scanner is desired prior to measurement by the scanner. In one case, the scanner may be attached to an articulated arm CMM that uses angular encoders in its joints to determine the position and orientation of the scanner attached to its end. In another case, the scanner includes inertial sensors placed within the device. Inertial sensors may include gyroscopes, accelerometers, and magnetometers, for example. Another method of determining the approximate position of the scanner is to illuminate photogrammetric dots placed on or around the object as marker points. In this way, the wide FOV camera in the scanner can determine the approximate position of the scanner in relation to the object.

In another embodiment, a CAD model on a computer screen indicates the regions where additional measurements are desired, and the operator moves the scanner by matching the features on the object to the features on the scanner. By updating the CAD model on the screen as a scan is taken, the operator may be given rapid feedback as to whether the desired regions of the part have been measured.

After the operator has moved the scanner into position, a measurement is made in block 1272 with the small FOV camera 24. By viewing a relatively smaller region in block 1272, the resolution of the resulting three-dimensional coordinates is improved to better characterize features such as holes and edges.

Because the narrow FOV camera views a relatively smaller region than the wide FOV camera, the projector 28 may illuminate a relatively smaller region. This has advantages in eliminating multipath interference since there is relatively fewer illuminated points on the object that can reflect light back onto the object. Having a smaller illuminated region may also make it easier to control exposure to obtain the optimum amount of light for a given reflectance and angle of incidence of the object under test. In the block 1274, if all points have been collected, the procedure ends at block 1276; otherwise it continues.

In an embodiment where, as indicated by block 1268, the mode is automated, then in block 1278 the automated mechanism moves the scanner into the desired position. In some embodiments, the automated mechanism will have sensors to provide information about the relative position of the scanner and object under test. For an embodiment in which the automated mechanism is a robot, angular transducers within the robot joints provide information about the position and orientation of the robot end effector used to hold the scanner. For an embodiment in which the object is moved by another type of automated mechanism, linear encoders or a variety of other sensors may provide information on the relative position of the object and the scanner.

After the automated mechanism has moved the scanner or object into position, then in block 1280 three-dimensional measurements are made with the small FOV camera. Such measurements are repeated by means of block 1282 until all measurements are completed and the procedure finishes at block 1284.

In one embodiment, the projector 28 changes the structured light pattern when the scanner switches from acquiring data with the second camera 26 to the first camera 24. In another embodiment, the same structured light pattern is used with both cameras 24, 26. In still another embodiment, the projector 28 emits a pattern formed by a swept line or point when the data is acquired by the first camera 24. After acquiring data with the first camera 24, the process continues scanning using the second camera 26. This process continues until the operator has scanned the desired surface area of the object under test.

It should be appreciated that while the process of FIG. 2 is shown as a linear or sequential process, in other embodiments one or more of the steps shown may be executed in parallel. In the method shown in FIG. 2, the method involved measuring the entire object first and then carrying out further detailed measurements according to an assessment of the acquired point cloud data. An alternative using the scanner 20 is to begin by measuring detailed or critical regions using the camera 24 having the small FOV.

It should also be appreciated that it is common practice in existing scanning systems to provide a way of changing the camera lens or projector lens to obtain a different FOV for the camera(s) or projector in the scanning system. However, such changes are time consuming and typically require an additional compensation step in which an artifact such as a dot plate is placed in front of the camera or projector to determine the aberration correction parameters for the camera or projector system. Hence a scanning system that provides two cameras having different FOVs, such as the cameras 24, 26 of FIG. 1, provides a significant advantage in measurement speed and in enablement of the scanner for a fully automated mode.

Figure 3:
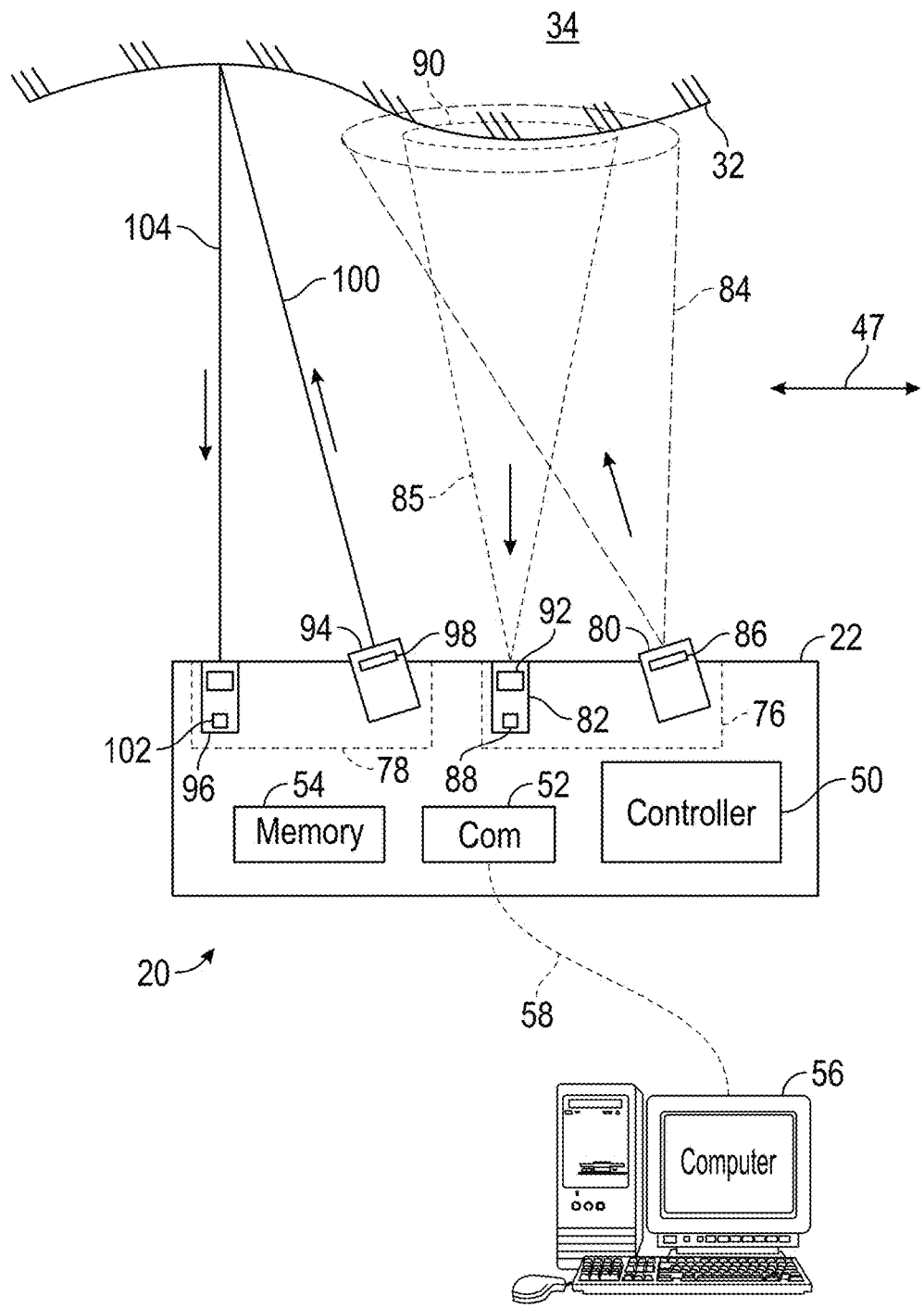
FIG. 3 is a top schematic view of a scanner in accordance with another embodiment of the invention.

Another embodiment is shown in FIG. 3 of a scanner 20 having a housing 22 that includes a first coordinate acquisition system 76 and a second coordinate acquisition system 78. The first coordinate acquisition system 76 includes a first projector 80 and a first camera 82. Similar to the embodiment of FIG. 1, the projector 80 emits light 84 onto a surface 32 of an object 34. In the exemplary embodiment, the projector 80 uses a visible or infrared light source that illuminates a pattern generator. The light source may be a laser, a superluminescent diode, an incandescent light, a light emitting diode (LED), or other light emitting device. In one embodiment, the pattern generator is a chrome-on-glass slide having a structured light pattern etched thereon. The slide may have a single pattern or multiple patterns that move in and out of position as needed. The slide may be manually or automatically installed in the operating position. In other embodiments, the source pattern may be light reflected off or transmitted by a digital micro-mirror device (DMD) such as a digital light projector (DLP) manufactured by Texas Instruments Corporation, a liquid crystal device (LCD), a liquid crystal on silicon (LCOS) device, or a similar device used in transmission mode rather than reflection mode. The projector 80 may further include a lens system 86 that alters the outgoing light to have the desired focal characteristics.

The first camera 82 includes a photosensitive array sensor 88 which generates a digital image/representation of the area 90 within the sensor's field of view. The sensor may be charged-coupled device (CCD) type sensor or a complementary metal-oxide-semiconductor (CMOS) type sensor for example having an array of pixels. The first camera 82 may further include other components, such as but not limited to lens 92 and other optical devices for example. The first projector 80 and first camera 82 are arranged at an angle in a fixed relationship such that the first camera 82 may detect light 85 from the first projector 80 reflected off of the surface 32 of object 34. It should be appreciated that since the first camera 92 and first projector 80 are arranged in a fixed relationship, the trigonometric principals discussed above may be used to determine coordinates of points on the surface 32 within the area 90. Although for clarity FIG. 3 is depicted as having the first camera 82 near to the first projector 80, it should be appreciated that the camera could be placed nearer the other side of the housing 22. By spacing the first camera 82 and first projector 80 farther apart, accuracy of 3D measurement is expected to improve.

The second coordinate acquisition system 78 includes a second projector 94 and a second camera 96. The projector 94 has a light source that may comprise a laser, a light emitting diode (LED), a superluminescent diode (SLED), a Xenon bulb, or some other suitable type of light source. In an embodiment, a lens 98 is used to focus the light received from the laser light source into a line of light 100 (the line being perpendicular to the plane of the paper in FIG. 3) and may comprise one or more cylindrical lenses, or lenses of a variety of other shapes. The lens is also referred to herein as a "lens system" because it may include one or more individual lenses or a collection of lenses. The line of light is substantially straight, i.e., the maximum deviation from a line will ordinarily be less than about 1% of its length. One type of lens that may be utilized by an embodiment is a rod lens. Rod lenses are typically in the shape of a full cylinder made of glass or plastic polished on the circumference and ground on both ends. Such lenses convert collimated light passing through the diameter of the rod into a line. Another type of lens that may be used is a cylindrical lens. A cylindrical lens is a lens that has the shape of a partial cylinder. For example, one surface of a cylindrical lens may be flat, while the opposing surface is cylindrical in form.

In another embodiment, the projector 94 generates a two-dimensional pattern of light that covers an area of the surface 32. The resulting coordinate acquisition system 78 is then referred to as a structured light scanner.

The second camera 96 includes a photosensitive array sensor 102 such as a charge-coupled device (CCD) type sensor or a complementary metal-oxide-semiconductor (CMOS) type sensor for example. The second camera 96 may further include other components, such as but not limited to lens 104 and other optical devices for example. The second projector 94 and second camera 96 are arranged at an angle such that the second camera 96 may detect light 106 from the second projector 94 reflected off of the object 34. It should be appreciated that since the second projector 94 and the second camera 96 are arranged in a fixed relationship, the trigonometric principles discussed above may be used to determine 3D coordinates of points on the surface 32 on the line formed by light 100. It should also be appreciated that the camera 96 and the projector 94 may be located on opposite sides of the housing 22 to increase 3D measurement accuracy.

In another embodiment, the second coordinate acquisition system is configured to project a variety of patterns, which may include not only a fixed line of light but also a swept line of light, a swept point of light, a coded pattern of light (covering an area), or a sequential pattern of light (covering an area). Each type of projection pattern has different advantages such as speed, accuracy, and immunity to multipath interference. By evaluating the performance requirements for each particular measurements and/or by reviewing the characteristics of the returned data or of the anticipated object shape (from CAD models or from a 3D reconstruction based on collected scan data), it is possible to select the type of projected pattern that optimizes performance.

In another embodiment, the distance from the second coordinate acquisition system 78 and the object surface 32 is different than the distance from the first coordinate acquisition system 76 and the object surface 32. For example, the camera 96 may be positioned closer to the object 32 than the camera 88. In this way, the resolution and accuracy of the second coordinate acquisition system 78 can be improved relative to that of the first coordinate acquisition system 76. In many cases, it is helpful to quickly scan a relatively large and smooth object with a lower resolution system 76 and then scan details including edges and holes with a higher resolution system 78.

A scanner 20 may be used in a manual mode or in an automated mode. In a manual mode, an operator is prompted to move the scanner nearer or farther from the object surface according to the acquisition system that is being used.

Furthermore, the scanner 20 may project a beam or pattern of light indicating to the operator the direction in which the scanner is to be moved. Alternatively, indicator lights on the device may indicate the direction in which the scanner should be moved. In an automated mode, the scanner 20 or object 34 may be automatically moved relative to one another according to the measurement requirements.

Similar to the embodiment of FIG. 1, the first coordinate acquisition system 76 and the second coordinate acquisition system 78 are electrically coupled to a controller 50 disposed within the housing 22. The controller 50 may include one or more microprocessors, digital signal processors, memory and signal conditioning circuits. The scanner 20 may further include actuators (not shown) which may be manually activated by the operator to initiate operation and data capture by the scanner 20. In one embodiment, the image processing to determine the X, Y, Z coordinate data (point cloud data) representing the surface 32 of object 34 is performed by the controller 50. The coordinate data may be stored locally such as in a volatile or nonvolatile memory 54 for example. The memory may be removable, such as a flash drive or a memory card for example. In other embodiments, the scanner 20 has a communications circuit 52 that allows the scanner 20 to transmit the coordinate data to a remote processing system 56. The communications medium 58 between the scanner 20 and the remote processing system 56 may be wired (e.g. Ethernet) or wireless (e.g. Bluetooth, IEEE 802.11). In one embodiment, the coordinate data is determined by the remote processing system 56 and the scanner 20 transmits acquired images on the communications medium 58.

Figure 4:
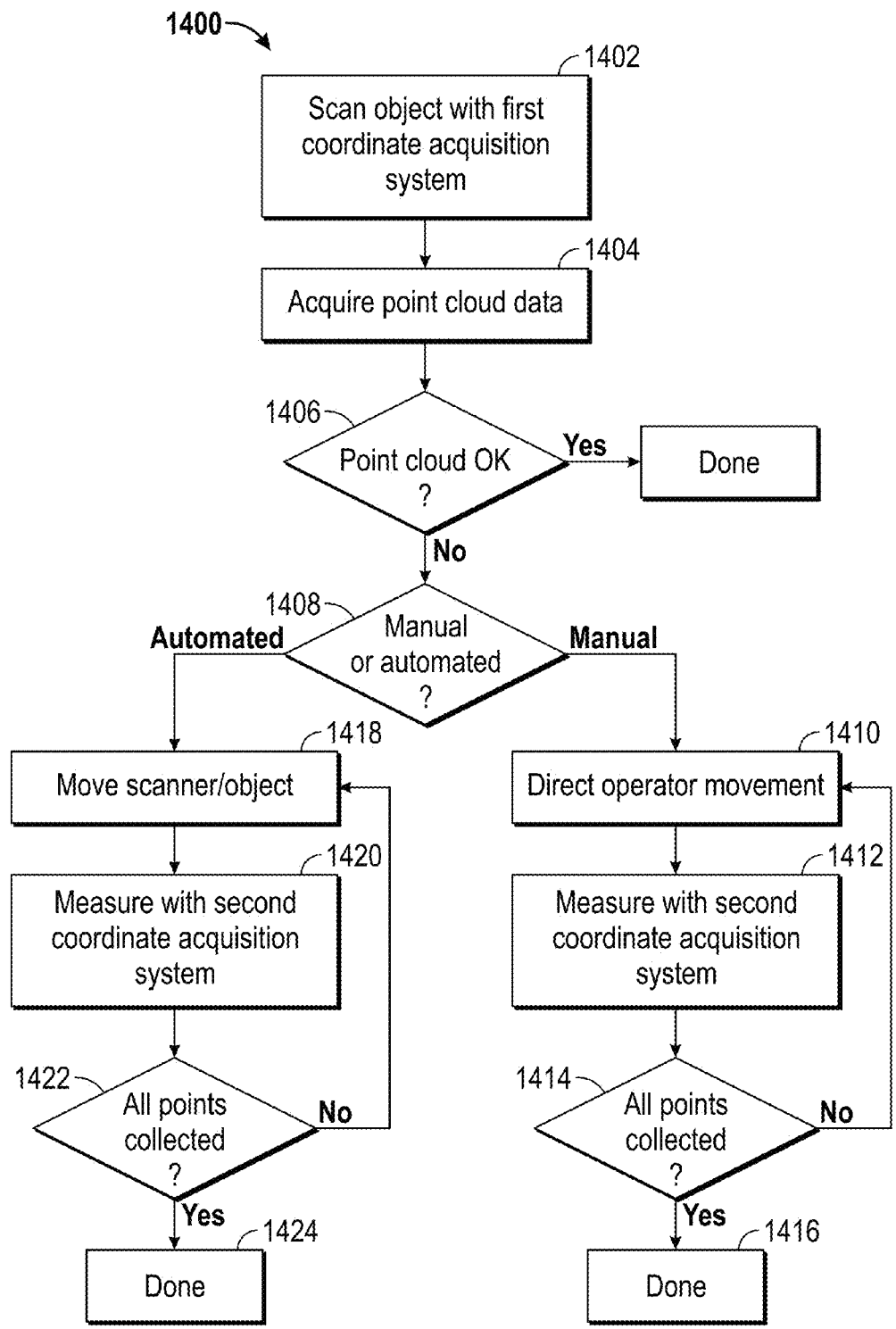
FIG. 4 is a flow chart showing a method of operating the scanner of FIG. 3.

Referring now to FIG. 4, the method 1400 of operating the scanner 20 of FIG. 3 will be described. In block 1402, the first projector 80 of the first coordinate acquisition system 76 of scanner 20 emits a structured light pattern onto the area 90 of surface 32 of the object 34. The light 84 from projector 80 is reflected from the surface 32 and the reflected light 85 is received by the first camera 82. As discussed above, the variations in the surface profile of the surface 32 create distortions in the imaged pattern of light received by the first photosensitive array 88. Since the pattern is formed by structured light, a line of light, or a point of light, it is possible in some instances for the controller 50 or the remote processing system 56 to determine a one to one correspondence between points on the surface 32 and the pixels in the photosensitive array 88. This enables triangulation principles discussed above to be used in block 1404 to obtain point cloud data, which is to say to determine X, Y, Z coordinates of points on the surface 32. By moving the scanner 20 relative to the surface 32, a point cloud may be created of the entire object 34.

In block 1406, the controller 50 or remote processing system 56 determines whether the point cloud data possesses the desired data quality attributes or has a potential problem. The types of problems that may occur were discussed hereinabove in reference to FIG. 2 and this discussion is not repeated here. Evaluation of potential issues may be carried out as described with reference to FIG. 12. If in step 1406 the controller determines that the point cloud has the desired data quality attributes, the procedure is finished. Otherwise, a determination is made in block 1408 of whether the scanner is used in a manual or automated mode. If the mode is manual, the operator is directed in block 1410 to move the scanner to the desired position.

There are several ways of indicating the desired movement by the operator as described hereinabove with reference to FIG. 2. This discussion is not repeated here.

To direct the operator in obtaining the desired movement, a method of determining the approximate position of the scanner is needed. As explained with reference to FIG. 2, methods may include attachment of the scanner 20 to an articulated arm CMM, use of inertial sensors within the scanner 20, illumination of photogrammetric dots, or matching of features to a displayed image, for example.

After the operator has moved the scanner into position, a measurement is made with the second coordinate acquisition system 78 in block 1412. By using the second coordinate acquisition system, resolution and accuracy may be improved or problems may be eliminated. In block 1414, if all points have been collected, the procedure ends at block 1416; otherwise it continues.

If the mode of operation from block 1408 is automated, then in block 1418 the automated mechanism moves the scanner into the desired position. In most cases, an automated mechanism will have sensors to provide information about the relative position of the scanner and object under test. For the case in which the automated mechanism is a robot, angular transducers within the robot joints provide information about the position and orientation of the robot end effector used to hold the scanner. For other types of automated mechanisms, linear encoders or a variety of other sensors may provide information on the relative position of the object and the scanner.

After the automated mechanism has moved the scanner or object into position, then in block 1420 three-dimensional measurements are made with the second coordinate acquisition system 78. Such measurements are repeated by means of block 1422 until all measurements are completed. The procedure finishes at block 1424.

It should be appreciated that while the process of FIG. 4 is shown as a linear or sequential process, in other embodiments one or more of the steps shown may be executed in parallel. In the method shown in FIG. 4, the method involves measuring the entire object first and then carrying out further detailed measurements according to an assessment of the acquired point cloud data. An alternative using scanner 20 is to begin by measuring detailed or critical regions using the second coordinate acquisition system 78.

It should also be appreciated that it is common practice in existing scanning systems to provide a way of changing the camera lens or projector lens as a way of changing the FOV of the camera or of projector in the scanning system. However, such changes are time consuming and typically require an additional compensation step in which an artifact such as a dot plate is placed in front of the camera or projector to determine the aberration correction parameters for the camera or projector system. Hence a system that provides two different coordinate acquisition systems such as the scanning system 20 of FIG. 3 provides a significant advantage in measurement speed and in enablement of the scanner for a fully automated mode.

An error may occur in making scanner measurements as a result of multipath interference. The origin of multipath interference is now discussed, and a first method for eliminating or reducing multipath interference is described.

The case of multipath interference occurs when the some of the light that strikes the object surface is first scattered off another surface of the object before returning to the camera. For the point on the object that receives this scattered light, the light sent to the photosensitive array then corresponds not only to the light directly projected from the projector but also to the light sent to a different point on the projector and scattered off the object. The result of multipath interference, especially for the case of scanners that project two-dimensional (structured) light, may be to cause the distance calculated from the projector to the object surface at that point to be inaccurate.

Figure 5:
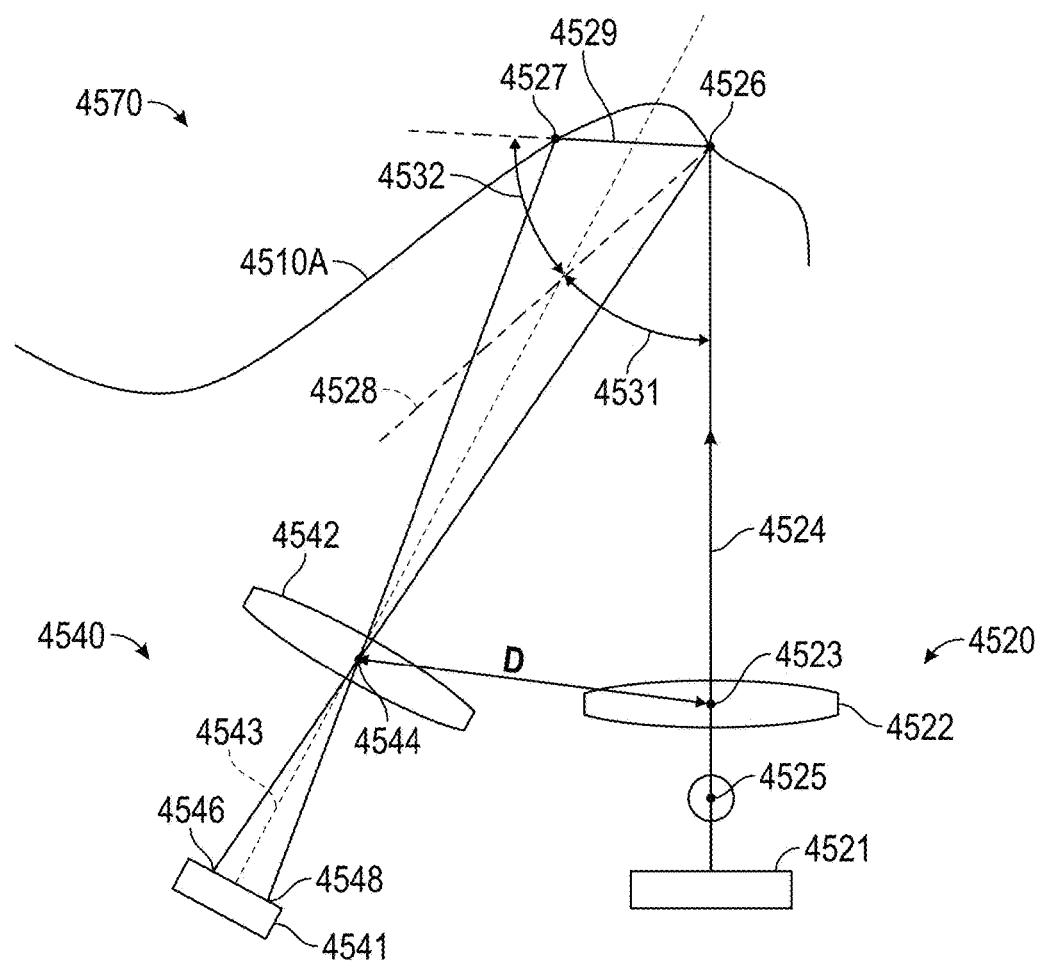
FIG. 5 is a schematic view of elements within a laser scanner according to an embodiment.

An instance of multipath interference is illustrated in reference to FIG. 5. In an embodiment a scanner 4570 projects a line of light 4525 onto the surface 4510A of an object. The line of light 4525 is perpendicular to the plane of the paper in FIG. 5. In an embodiment, the rows of a photosensitive array are parallel to the plane of the paper and the columns are perpendicular to the plane of the paper. Each row represents one point on the projected line 4525 in the direction perpendicular to the plane of the paper. The distance from the projector to the object for that point on the line is found by first calculating the centroid for each row. For the surface point 4526, the centroid on the photosensitive array 4541 is represented by the point 4546. The position 4546 of the centroid on the photosensitive array can be used to calculate the distance from the camera perspective center 4544 to the object point 4526. This calculation is based on trigonometric relationships according to the principles of triangulation. To perform these calculations, the baseline distance D from the camera perspective center 4544 to the projector perspective center 4523 is required. In addition, knowledge of the relative orientation of the projector system 4520 to the camera system 4540 is required.

To understand the error caused by multipath interference, consider the point 4527. Light reflected or scattered from this point is imaged by the lens 4542 onto the point 4548 on the photosensitive array 4541. However, in addition to the light received directly from the projector and scattered off the point 4527, additional light is reflected off the point 4526 onto the point 4527 before being imaged onto the photosensitive array. The light 4527 will mostly likely be scattered to an unexpected position and cause two centroids to be formed in a given row. Consequently observation of two centroids on a given row is a good indicator of the presence of multipath interference.

For the case of structured light projected onto an area of the object surface, a secondary reflection from a point such as 4527 is not usually as obvious as for light projected onto a line and hence is more likely to create an error in the measured 3D surface coordinates.

By using a projector having an adjustable pattern of illumination on a display element 4521, it is possible to vary the pattern of illumination. The display element 4521 might be a digital micromechanical mirror (DMM) such as a digital light projector (DLP). Such devices contain multiple small mirrors that are rapidly adjustable by means of an electrical signal to rapidly adjust a pattern of illumination. Other devices that can produce an electrically adjustable display pattern include an LCD (liquid crystal display) and an LCOS (liquid crystal on silicon) display.

A way of checking for multipath interference in a system that projects structured light over an area is to change the display to project a line of light. The presence of multiple centroids in a row will indicate that multipath interference is present. By sweeping the line of light, an area can be covered without requiring that the probe be moved by an operator.

The line of light can be set to any desired angle by an electrically adjustable display. By changing the direction of the projected line of light, multipath interference can, in many cases, be eliminated.

For surfaces having many fold and steep angles so that reflections are hard to avoid, the electrically adjustable display can be used to sweep a point of light. In some cases, a secondary reflection may be produced from a single point of light, but it is usually relatively easy to determine which of the reflected spots of light is valid.

An electrically adjustable display can also be used to quickly switch between a coded and an uncoded pattern. In most cases, a coded pattern is used to make a 3D measurement based on a single frame of camera information. On the other hand, multiple patterns (sequential or uncoded patterns) may be used to obtain greater accuracy in the measured 3D coordinate values.

The coordinates may also be analyzed to determine the approximate distance to the target, thereby providing a starting distance for a more accurate measurement method such as a method that sequentially projects sinusoidal phase-shifted patterns of light onto a surface, as discussed hereinabove. Obtaining a starting distance for each point on the surface using the coded light pattern reduces or eliminates the need to obtain this information by vary the pitch in multiple sinusoidal phase-shifted scans, thereby saving considerable time.

In the past, electrically adjustable displays have been used to project each of a series of patterns within a sequential pattern—for example, a series of gray scale line patterns followed by a sequence of sinusoidal patterns, each having a different phase.

The present inventive method provides advantages over earlier methods in selecting those methods that identify or eliminate problems such as multipath interference and that indicate whether a single-shot pattern (for example, coded pattern) or a multiple-shot pattern is preferred to obtain the desired accuracy as quickly as possible.

Figure 5B:
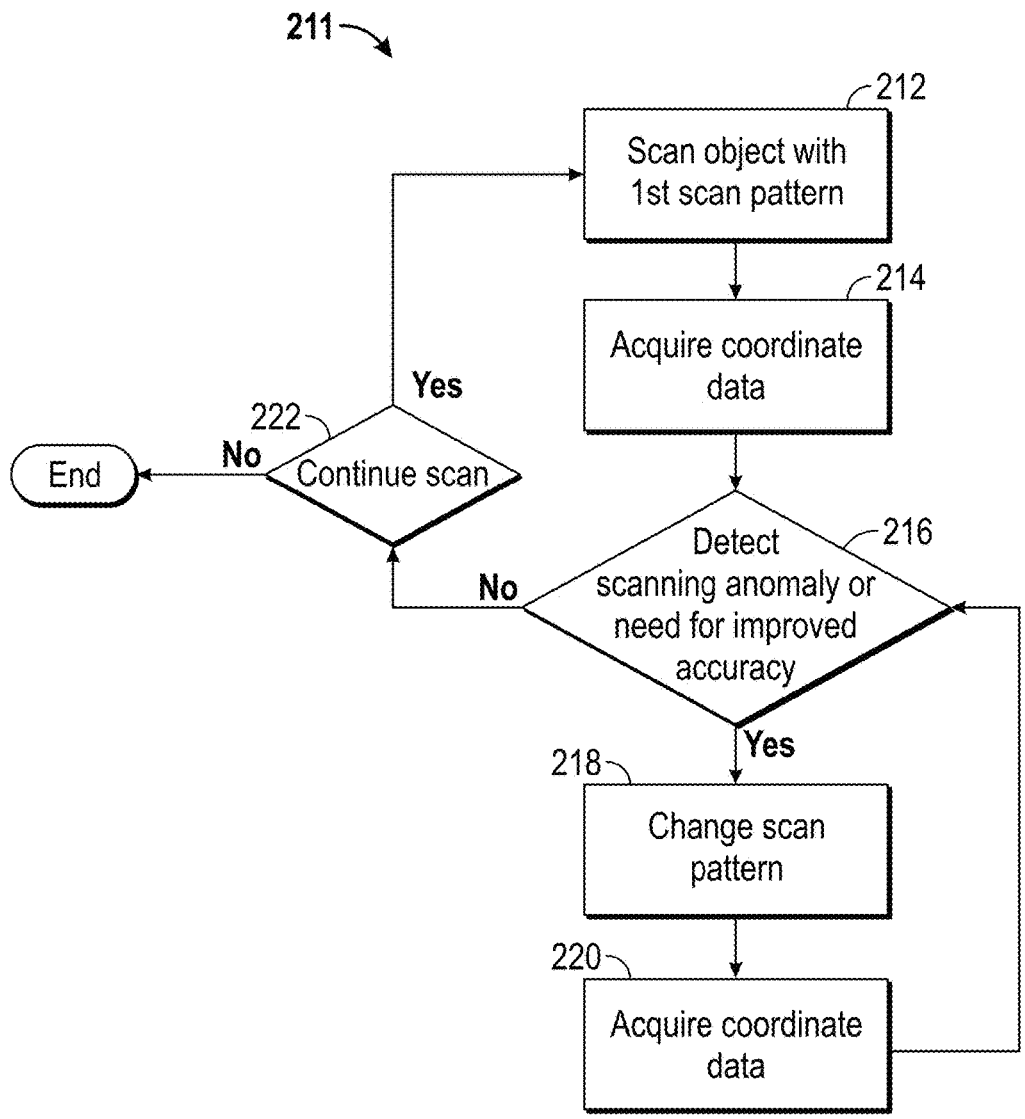
FIG. 5B is a flow chart showing a method of operating a scanner according to an embodiment.

Referring now to FIG. 5B, an embodiment is shown for overcoming anomalies or improving accuracy in coordinate data acquired by scanner 20. The process 211 starts in block 212 by scanning an object, such as object 34, with a scanner 20. The scanner 20 may be a scanner such as those described in the embodiments of FIG. 1, 3, 5 and FIG. 7 for example having at least one projector and a camera. In this embodiment, the scanner 20 projects a first light pattern onto the object in block 212. In one embodiment, this first light pattern is a coded structured light pattern. The process 211 acquires and determines the three-dimensional coordinate data in block 214. The coordinate data is analyzed in query block 216 to determine if there are any anomalies, such as the aforementioned multipath interference, low resolution around an element, or an absence of data due to surface angles or surface reflectance changes. When an anomaly is detected, the process 211 proceeds to block 218 where the light pattern emitted by the projector is changed to a second light pattern. In an embodiment, the second light pattern is a swept line of light. In another embodiment, the second light pattern is a swept point of light.

After projecting the second light pattern, the process 211 proceeds to block 220 where the three-dimensional coordinate data is acquired and determined for the area where the anomaly was detected. The process 211 loops back to query block 216 where it is determined if the anomaly has been resolved. If the query block 216 still detects an anomaly or lack or accuracy or resolution, the process loops back to block 218 and switches to a third light pattern. In an embodiment, the third light pattern is a sequential sinusoidal phase shift pattern. In another embodiment, the third light pattern is a swept point of light. This iterative procedure continues until the anomaly has been resolved. Once coordinate data from the area of the anomaly has been determined, the process 211 proceeds to block 222 where the emitted pattern is switched back to the first structured light pattern and the scanning process is continued. The process 211 continues until the operator has scanned the desired area of the object. In the event that the scanning information obtained using the method of FIG. 5B is not satisfactory, a method of measuring with a tactile probe, as discussed herein with respect to FIG. 11, may be used.

Figure 6:
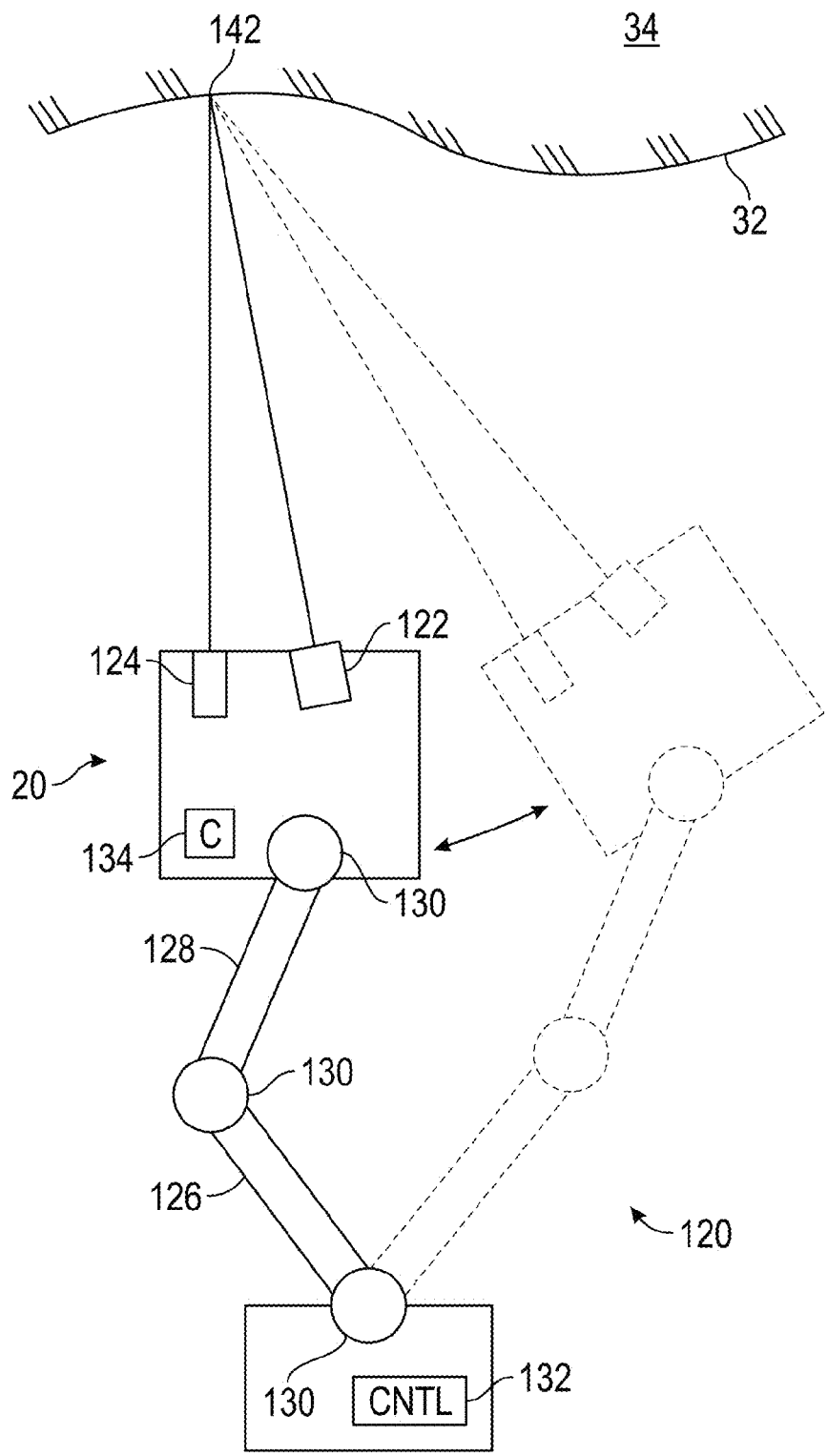
FIG. 6 is a top schematic view of a scanner in accordance with another embodiment of the invention.

Referring now to FIG. 6, another embodiment of a scanner 20 is shown mounted to a movable apparatus 120. The scanner 20 has at least one projector 122 and at least one camera 124 that are arranged in a fixed geometric relationship such that trigonometric principles may be used to determine the three-dimensional coordinates of points on the surface 32. The scanner 20 may be the same scanner as described in reference to FIG. 1 or FIG. 3 for example. In one embodiment, the scanner is the same as the scanner of FIG. 10 having a tactile probe. However the scanner used in the embodiment of FIG. 6 may be any scanner such as a structured light or line scanner, for example, a scanner disclosed in commonly owned U.S. Pat. No. 7,246,030 entitled "Portable Coordinate Measurement Machine with Integrated Line Laser Scanner" filed on 18 Jan. 2006 which is incorporated by reference herein. In another embodiment, the scanner used in the embodiment of FIG. 6 is a structured light scanner that projects light over an area on an object.

In the exemplary embodiment, the moveable apparatus 120 is a robotic apparatus that provides automated movements by means of arm segments 126, 128 that are connected by pivot and swivel joints 130 to allow the arm segments 126, 128 to be moved, resulting in the scanner 20 moving from a first position to a second position (as indicated in dashed line in FIG. 6). The moveable apparatus 120 may include actuators, such as motors (not shown), for example, that are coupled to the arm segments 126, 128 to move the arm segments 126, 128 from the first position to the second position. It should be appreciated that a movable apparatus 120 having articulated arms is for exemplary purposes and the claimed invention should not be so limited. In other embodiments, the scanner 20 may be mounted to a movable apparatus that moves the scanner 20 via rails, wheels, tracks, belts or cables or a combination of the foregoing for example. In other embodiments, the robot has a different number of arm segments.

Angular measurement devices such as angular encoders may be used to measure the angles between the arm segments in articulated arm structures, for use in calculating the position and orientation of the scanner 20. Similarly, for scanners attached to linearly moving actuators, linear encoders or similar measuring devices may be used. In some cases, the measuring devices are highly accurate and provide the desired measurement accuracy. In other cases, multiple frames of point cloud data may be combined by matching common features within the scanned regions. In yet other cases, multiple frames of point cloud data may be combined by matching external targets such as photogrammetry targets captured with cameras (the camera(s) in FIG. 6 or different cameras, such as external to the scanner 200 for example).

In one embodiment, the movable apparatus is an articulated arm coordinate measurement machine (AACMM) such as that described in commonly owned U.S. patent application Ser. No. 13/491,176 filed on Jan. 20, 2010. In this embodiment, the movement of the scanner 20 from the first position to the second position may involve the operator manually moving the arm segments 126, 128.

For an embodiment having an automated apparatus, the moveable apparatus 120 further includes a controller 132 that is configured to energize the actuators to move the arm segments 126, 128. In one embodiment, the controller 132 communicates with a controller 134 by wired or wireless means. As will be discussed in more detail below, this arrangement allows the controller 132 to move the scanner 20 in response to an anomaly in the acquired data. It should be appreciated that the controllers 132, 134 may be incorporated into a single processing unit or the functionality may be distributed among several processing units, which may include an external computer or networked computer.

Figure 12:
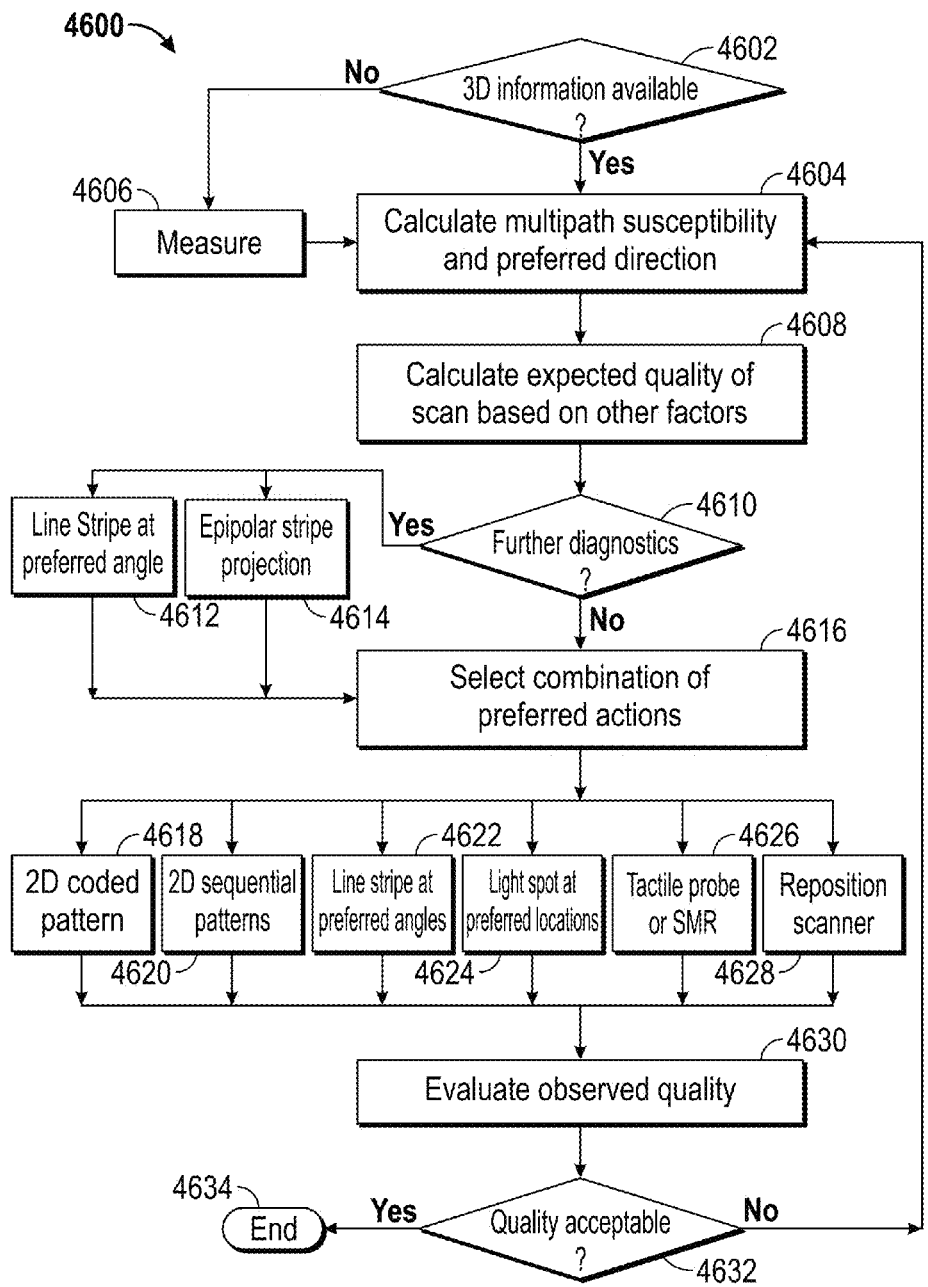
FIG. 12 is a flow chart showing a diagnostic method according to an embodiment.
Figure 13:
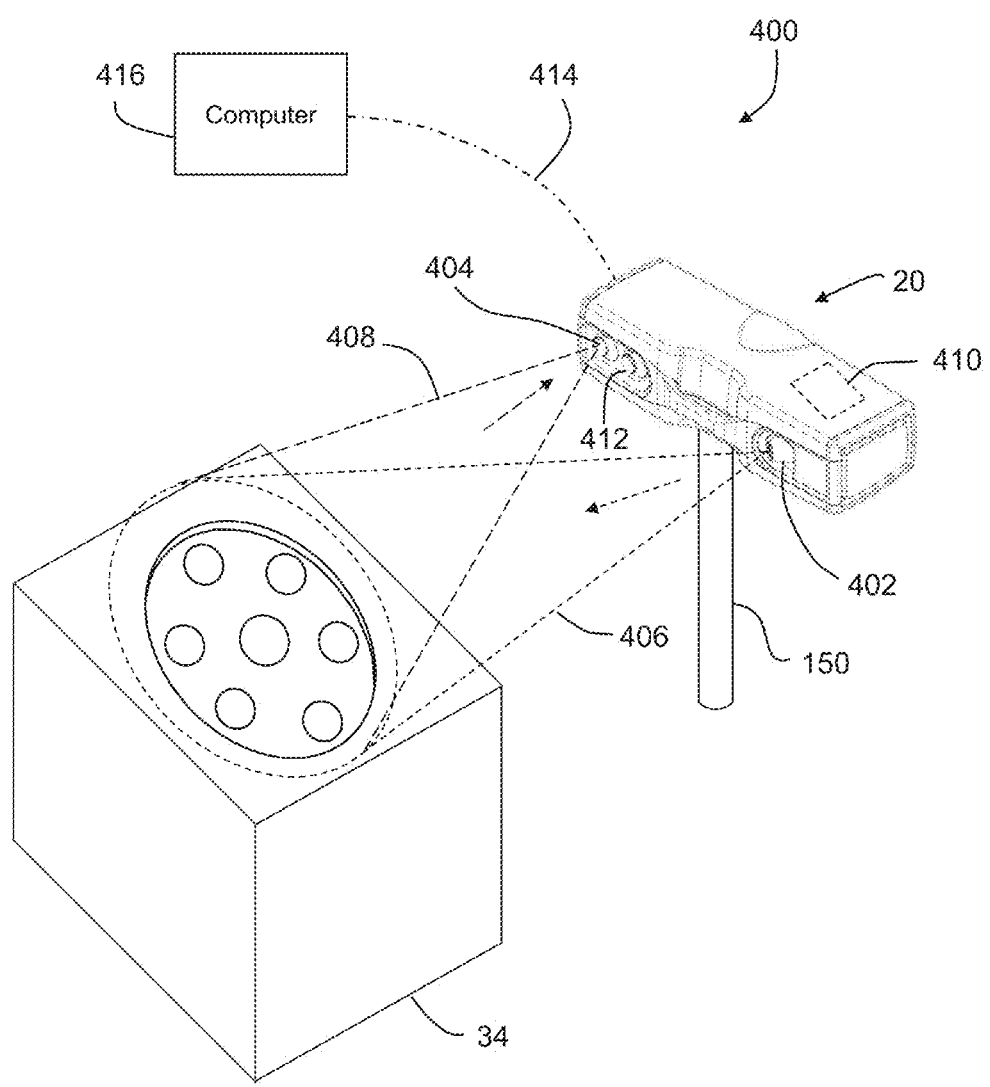
FIG. 13 is a perspective view of a system for scanning and performing an inspection plan in accordance with an embodiment of the invention.
Figure 14:
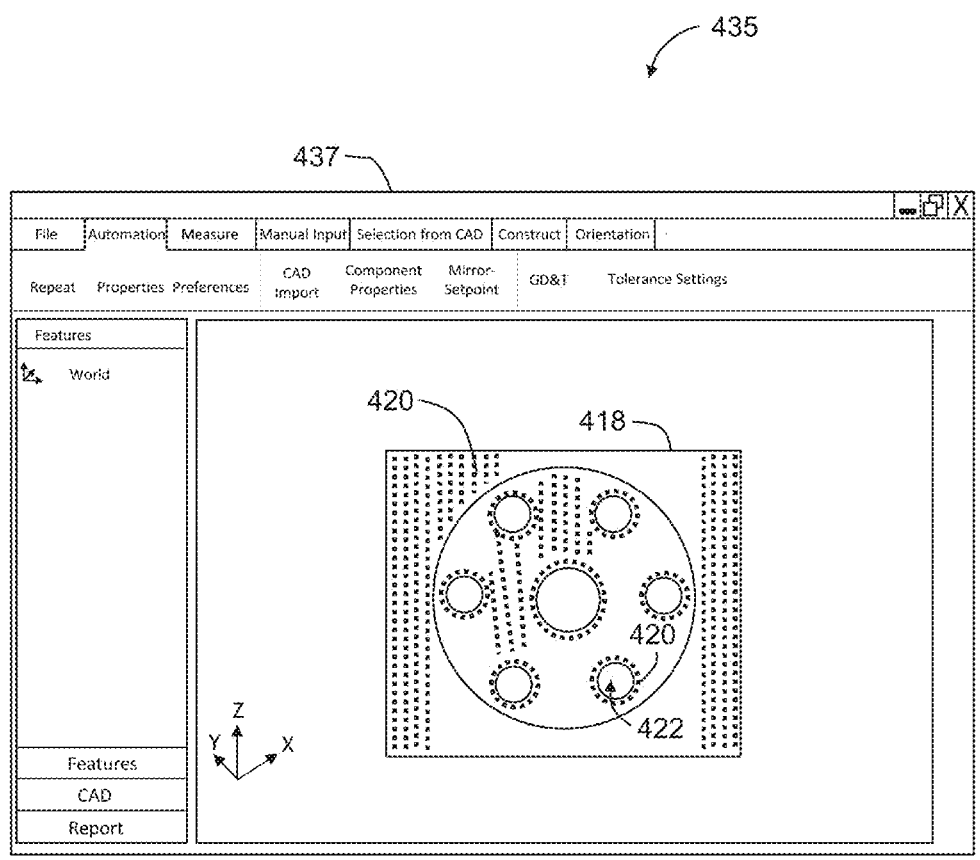
FIG. 14 is an illustration of a user interface in accordance with an embodiment of the invention.
Figure 15:
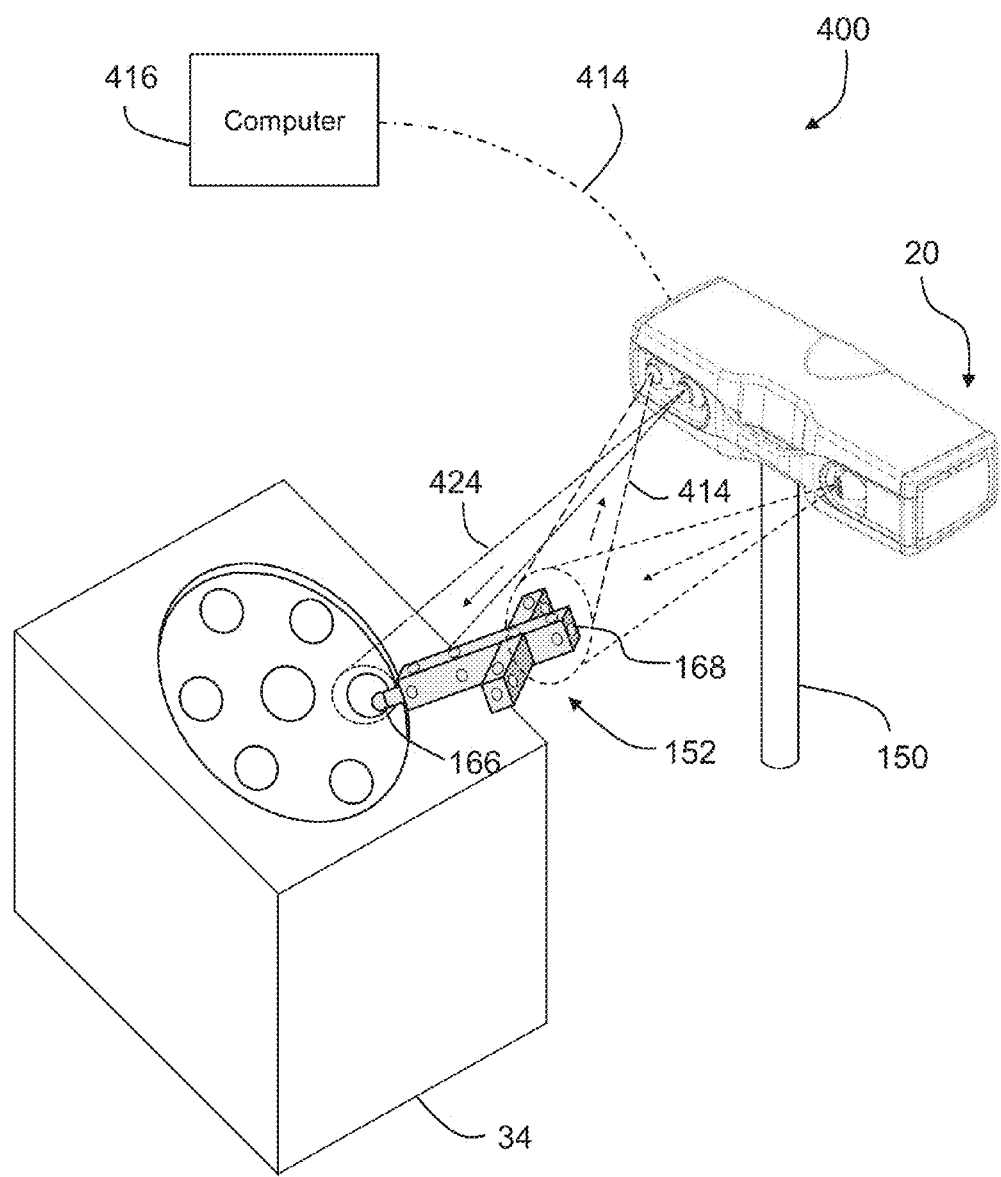
FIG. 15 is a perspective view of the system of FIG. 13 with a remote probe.

By carrying out an analysis as described with reference to FIG. 12, it is possible to determine a suitable position and orientation for the scanner 20 to obtain the desired measurement results. In some embodiments, a feature being measured may benefit from orienting the scanner in a desired orientation. For example, measurement of the diameter of a hole may be improved by orienting the scanner camera 124 to be approximately perpendicular to the hole. In other embodiments, a scanner may be positioned so as to reduce or minimize the possibility of multipath interference. Such an analysis may be based on a CAD model available as a part of the diagnostic procedure or it may be based on data collected by the scanner in an initial position prior to a secondary movement of the scanner 20 by the apparatus 120.

Figure 7:
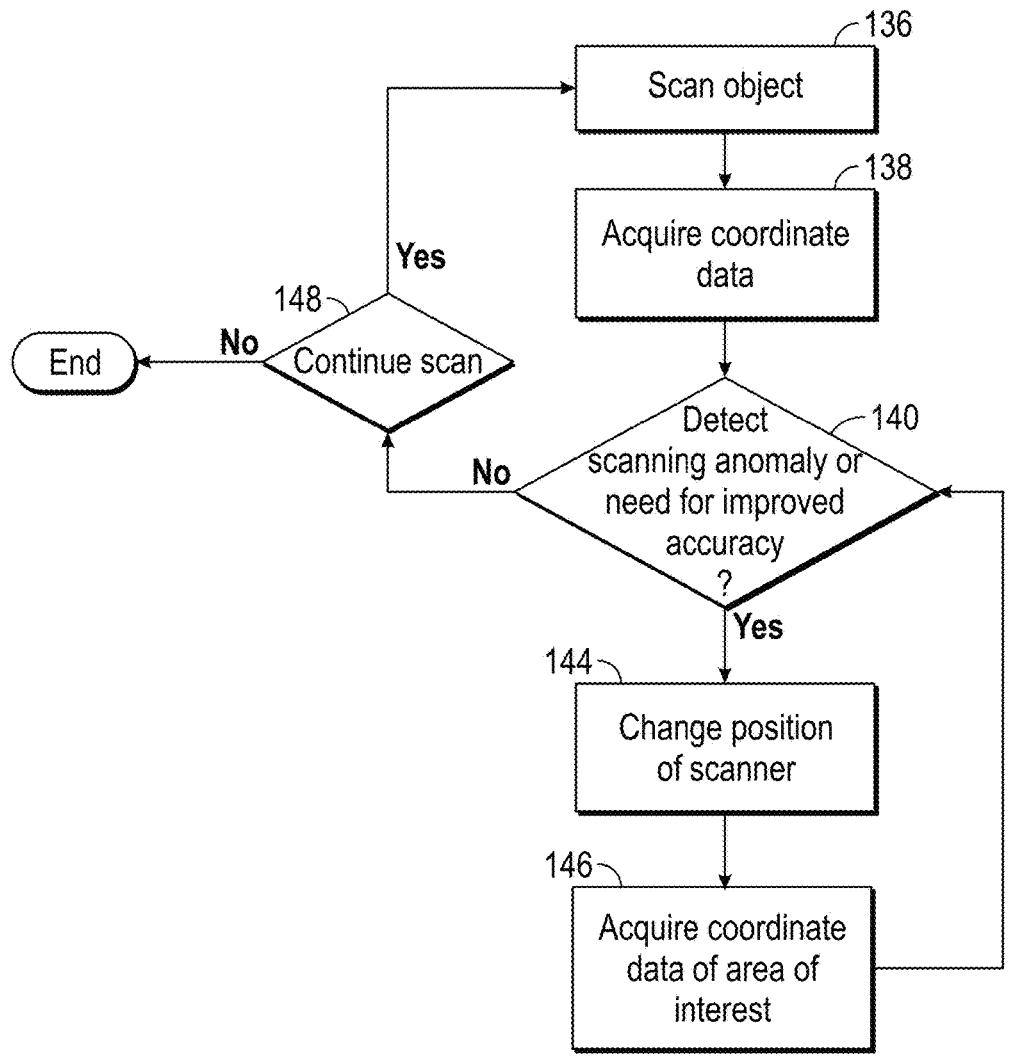
FIG. 7 is a flow chart showing a method of operating the scanner according to an embodiment.

Referring now to FIG. 7, the operation of the scanner 20 and movable apparatus 120 will be described. The process starts in block 136 with scanning the object 34 with the scanner 20 in the first position. The scanner 20 acquires and determines coordinate data for points on the surface 32 of the object 34 in block 138. It should be appreciated that the movable apparatus 120 may move the scanner 20 to acquire data on surface points in a desired area. In query block 140, it is determined whether there is an anomaly in the coordinate data at point 142, such as multipath interference, for example, or whether there is a need to change direction to obtain improved resolution or measurement accuracy. It should be appreciated that the point 142 of FIG. 6 may represent a single point, a line of points or an area on the surface 32. If an anomaly or need for improved accuracy is detected, the process continues to block 144 where the movable apparatus 120 moves the position of the scanner 20, such as from the first position to the second position, and rescans the area of interest in block 146 to acquire three-dimensional coordinate data. The process loops back to query block 140 where it is determined whether there is still an anomaly in the coordinate data or if an improvement measurement accuracy is desired. If these cases, the scanner 20 is moved again and the process continues until the measurement results achieve a desired level. Once the coordinate data is obtained, the process proceeds from query block 140 to block 148 where the scanning process continues until the desired area has been scanned.

In embodiments where the scanner 20 includes a tactile probe (FIG. 10), the movement of the scanner from the first position to the second position may be arranged to contact the areas of interest with the tactile probe. Since the position of the scanner, and thus the tactile probe, may be determined from the position and orientation of the arm segments 126, 128 the three-dimensional coordinates of the point on the surface 32 may be determined.

Figure 8A:
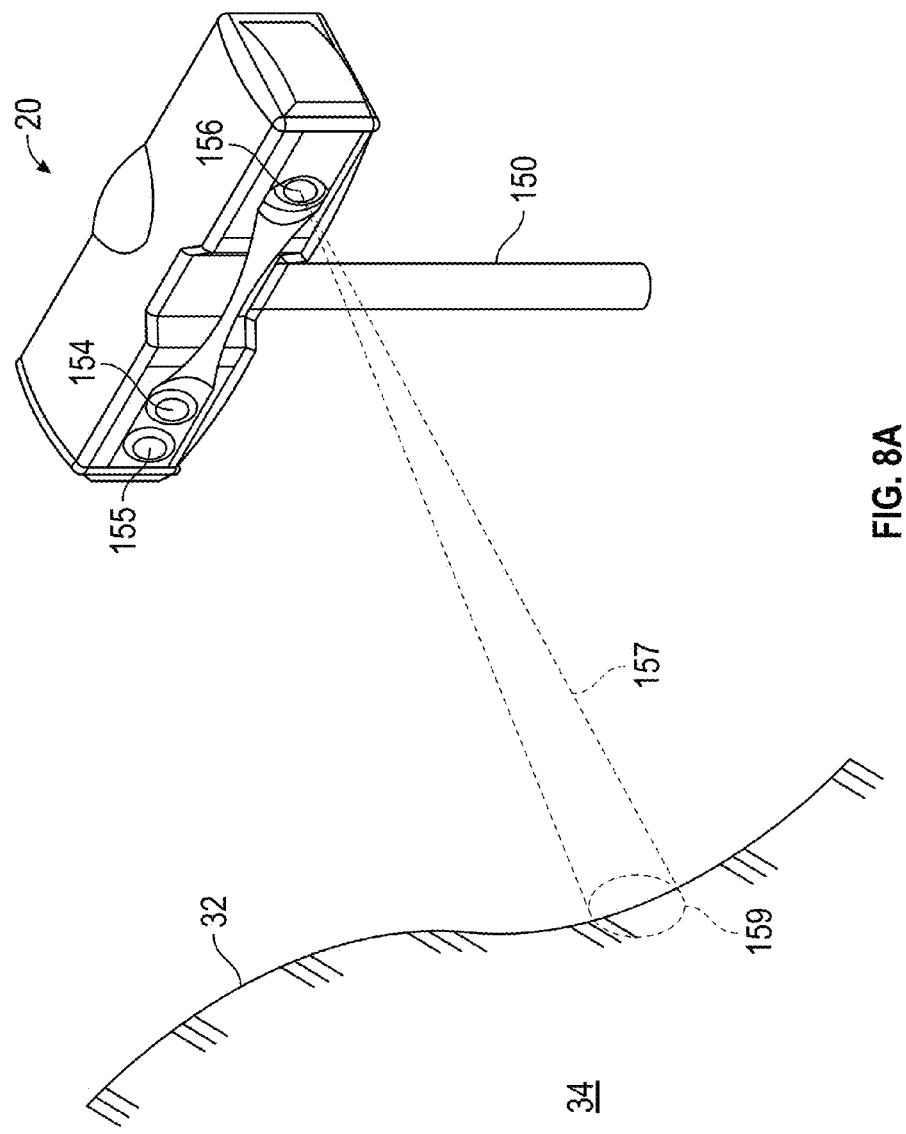

In some embodiments, measurement results obtained by the scanner 20 of FIGS. 8A, 8B may be corrupted by multipath interference. In other cases, measurement results may not provide the desired resolution or accuracy to properly measure some characteristics of the surface 32, especially edges, holes, or intricate features. In these cases, it may be desirable to have an operator use a remote probe 152 to interrogate points or areas on the surface 32. In one embodiment shown in FIGS. 8A, 8B, the scanner 20 includes a projector 156 and cameras 154, 155 arranged on an angle relative to the projector 156 such that light emitted by the projector 156 is reflected off of the surface 32 and received by one or both of the cameras 154, 155. The projector 156 and cameras 154,156 are arranged in a fixed geometric relationship so that trigonometric principles may be used to determine the three-dimensional coordinates of points on the surface 32.

In one embodiment, the projector 156 is configured to emit a visible light 157 onto an area of interest 159 on the surface 32 of object 34 as shown in FIG. 8A. The area of interest 159 may be an area suspected to be corrupted by multipath interference or an area for which the projected light does not provide adequate resolution near edges, for example. That the proper area of interest 159 has been targeted by the projected visible light 157 may be confirmed by calculating three-dimensional coordinates of the illuminated area using the images of camera 154 or 155 or both. In an embodiment, the scanner 20 is held in a substantially fixed location with a frame or fixture 150.

The scanner 20 is configured to cooperate with the remote probe 152 shown in FIG. 8B so that an operator may bring a probe tip 166 into contact with the object surface 132 at the illuminated region of interest 159. In an embodiment, the remote probe 152 includes at least three non-collinear points of light 168. The points of light 168 may be spots of light produced, for example, by light emitting diodes (LED) or reflective dots of light illuminated by infrared or visible light source from the projector 156 or from another light source not depicted in FIG. 8B. The infrared or visible light source in this case may be attached to the scanner 20 or may be placed external to the scanner 20. By determining the three-dimensional coordinates of the spots of light 168 with the scanner and by using information on the geometry of the probe 152, the position of the probe tip 166 may be determined, thereby enabling the coordinates of the object surface 32 to be determined. A tactile probe used in this way eliminates potential problems from multipath interference and also enables relatively accurate measurement of holes, edges, and detailed features. In an embodiment, the probe tip 166 may be activated by pressing of an actuator button (not shown) on the probe, or the probe 166 may be a touch-trigger probe activated by contact with the surface 32. In response to a signal produced by the actuator button or the touch trigger probe, a communications circuit (not shown) transmits a signal to the scanner 20. In an embodiment, the points of light 168 are replaced with geometrical patterns of light, which may include lines or curves.

Figure 9:
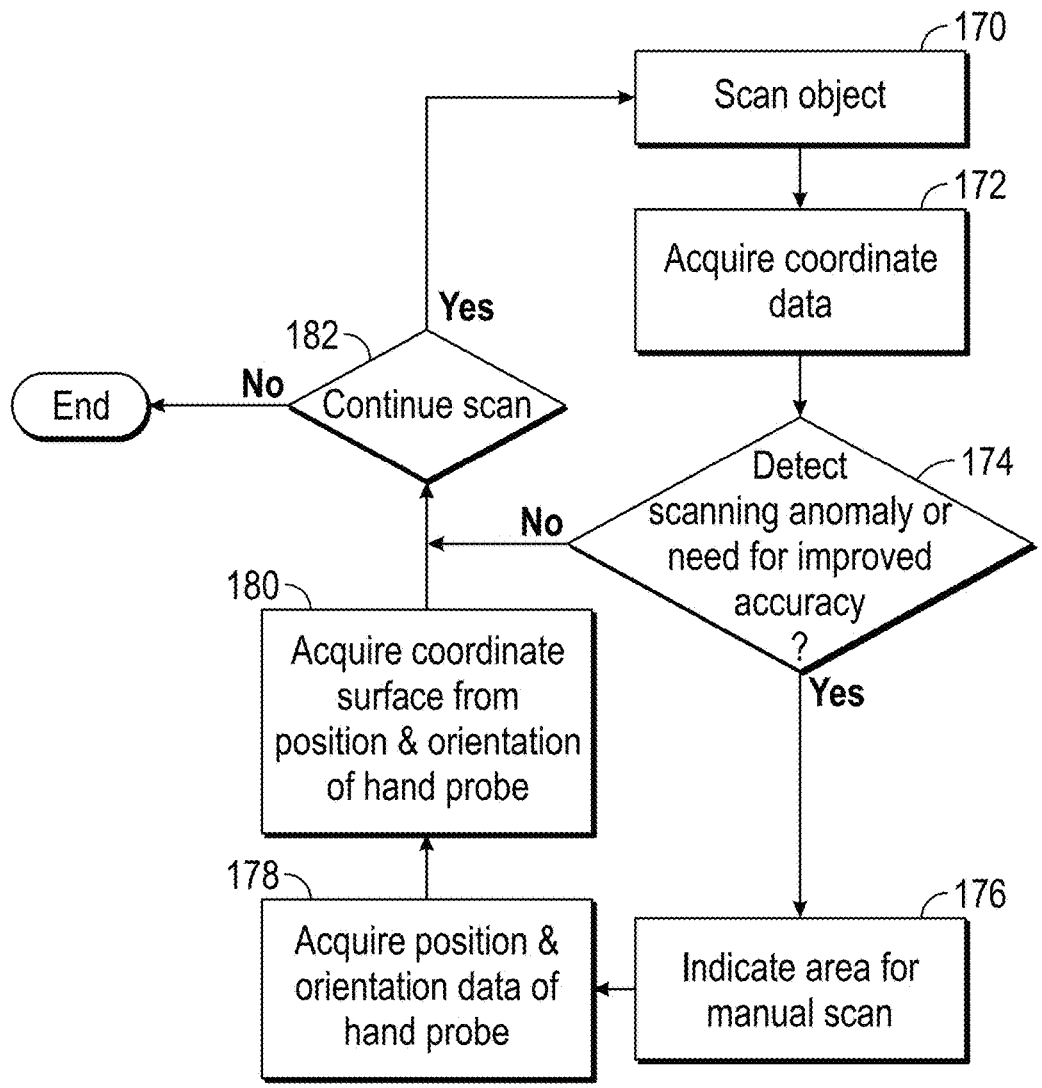
FIG. 9 is a flow chart showing a method of operating the scanner of FIG. 5.

Referring now to FIG. 9, a process is shown for acquiring coordinate data for points on the surface 32 of object 34 using a stationary scanner 20 of FIGS. 8A, 8B with a remote probe 152. The process starts in block 170 with the surface 32 of the object 34 being scanned. The process acquires and determines the three-dimensional coordinate data of the surface 32 in block 172. The process then determines in query block 174 whether there is an anomaly in the coordinate data of area 159 or whether there is a problem in accuracy or resolution of the area 159. An anomaly could be invalid data that is discarded due to multipath interference for example. An anomaly could also be missing data due to surface reflectance or a lack of resolution around a feature such as an opening or hole for example. Details on a diagnostic procedure for detecting (identifying) multipath interference and related problems in given in reference to FIG. 12.

Once the anomaly has been found within an area 159, then in block 176 the scanner 20 indicates to the operator the area 159 that is to be measured with the remote probe 152. The area 159 may be indicated by illuminating the area 159 with a visible light 157, as described hereinabove. In one embodiment, the visible light 157 is emitted by the projector 156. The color of light 157 may be changed to inform the operator of the type of anomaly or problem. For example, where multipath interference occurs, the light 157 may be colored red, while a low resolution may be colored green. The area may further be indicated on a display having a graphical representation (e.g. a CAD model) of the object. The display may be part of an external computer, part of a display built into the scanner 20, or part of a handheld device such as a smart phone.

The process then proceeds to block 178 to acquire an image or images of the remote probe 152 when the sensor 166 touches the surface 32. The image(s) may be obtained when points of light 168, which may be LEDs or reflective targets, for example, are imaged by one or more of the cameras 154, 155. Using best-fit techniques well known to mathematicians, the scanner 20 determines in block 180 the three-dimensional coordinates of the center of probe tip 166, from which three-dimensional coordinates of the object surface 32 are determined in block 180. Once the surface points in the area 159 (where the anomaly was detected) have been acquired, scanning continues in block 182 until the desired areas have been scanned.

Figure 10:
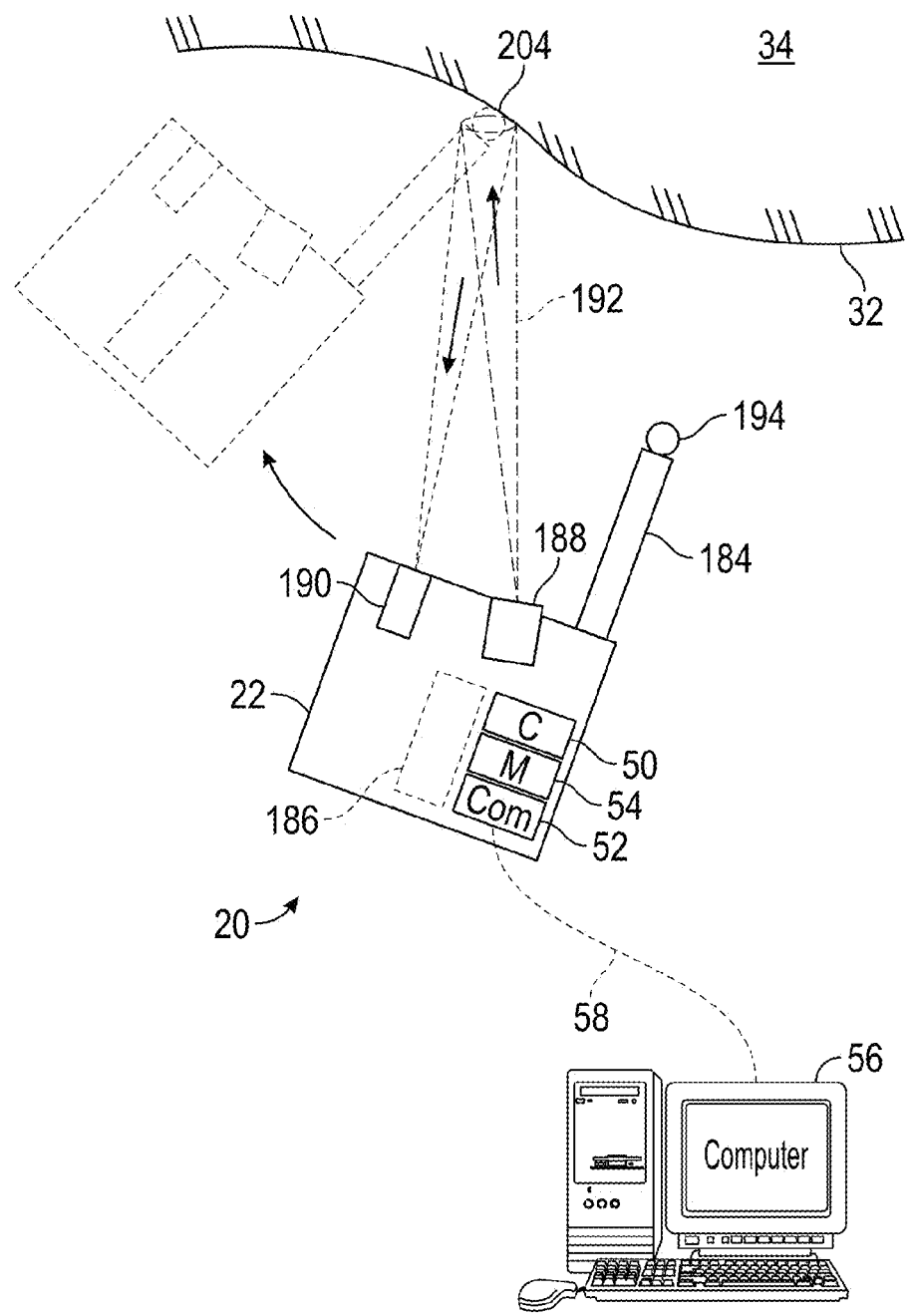
FIG. 10 is top schematic view of a scanner according to an embodiment.

Referring now to FIG. 10, another embodiment is shown of the scanner 20. In an embodiment, the scanner 20 is handheld by the operator during operation. In this embodiment, the housing 22 may include a handle 186 that allows the operator to hold the scanner 20 during operation. The housing 22 includes a projector 188 and a camera 190 arranged on an angle relative to each other such that the light 192 emitted by the projector is reflected off of the surface 32 and received by the camera 190. The triangulation-type scanner 20 of FIG. 10 operates in a manner substantially similar to the embodiments of FIG. 1 and FIG. 3 and acquires three-dimensional coordinate data of points on the surface 32 using trigonometric principles.

The scanner 20 further includes an integral probe member 184. The probe member 184 includes a probe tip 194 on one end. The sensor 194 is a tactile probe that may respond to pressing of an actuator button (not shown) by an operator or it may be a touch trigger probe that responds to contact with the surface 32, for example. As will be discussed in more detail below, the probe member 184 allows the operator to acquire coordinates of points on the surface 32 by contacting the probe tip 194 to the surface 32.

The projector 188, camera 190 and actuator circuit for the probe tip 194 are electrically coupled to a controller 50 disposed within the housing 22. The controller 50 may include one or more microprocessors, digital signal processors, memory and signal conditioning circuits. The scanner 20 may further include actuators (not shown), such as on the handle 186 for example, which may be manually activated by the operator to initiate operation and data capture by the scanner 20. In one embodiment, the image processing to determine the X, Y, Z coordinate data (point cloud data) representing the surface 32 of object 34 is performed by the controller 50. The coordinate data may be stored locally such as in a volatile or nonvolatile memory 54 for example. The memory may be removable, such as a flash drive or a memory card for example. In other embodiments, the scanner 20 has a communications circuit 52 that allows the scanner 20 to transmit the coordinate data to a remote processing system 56. The communications medium 58 between the scanner 20 and the remote processing system 56 may be wired (e.g. Ethernet) or wireless (e.g. Bluetooth, IEEE 802.11). In one embodiment, the coordinate data is determined by the remote processing system 56 and the scanner 20 transmits acquired images on the communications medium 58.

Figure 11:
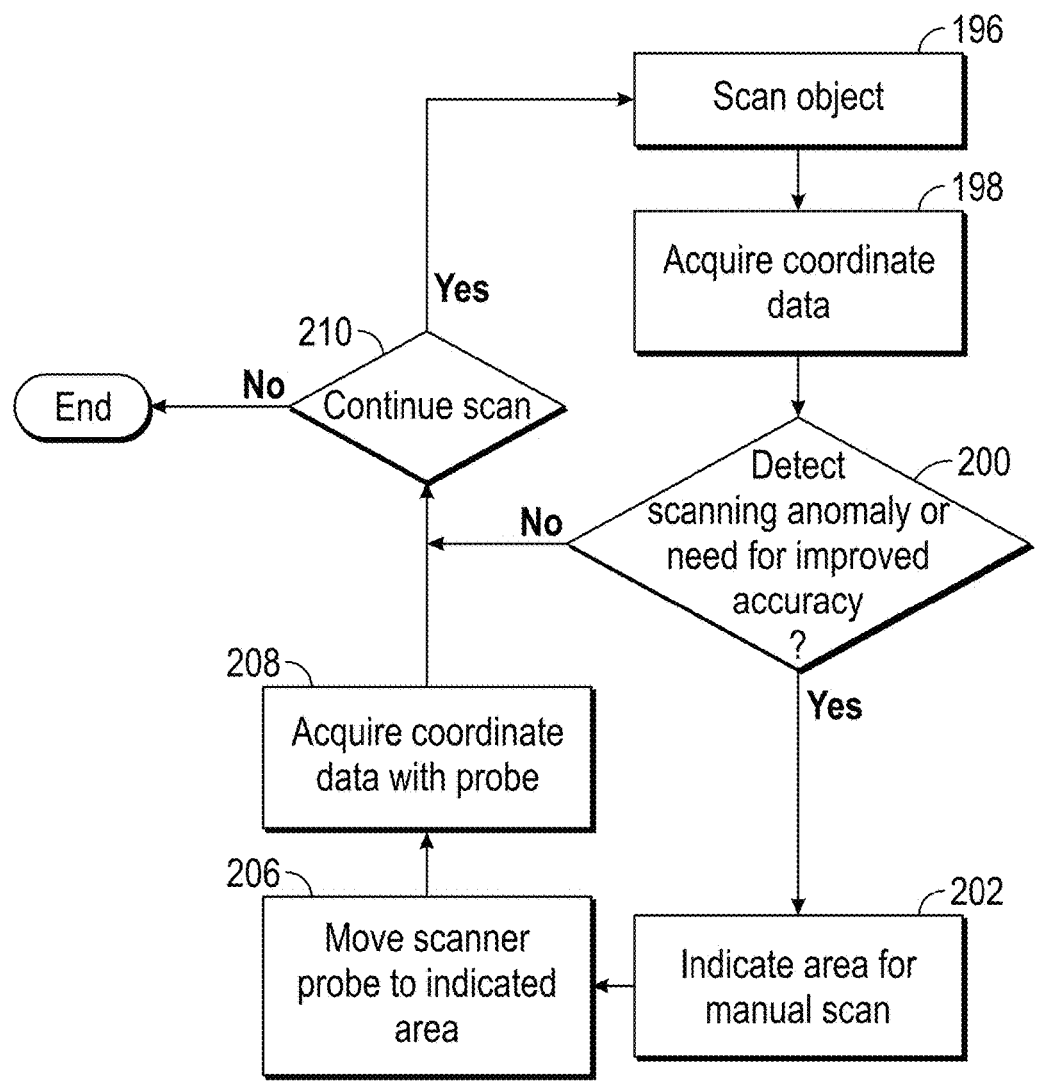
FIG. 11 is a flow chart showing a method of operating the scanner of FIG. 10.

Referring now to FIG. 11, the operation of the scanner 20 of FIG. 10 will be described. The process begins in block 196 with the operator scanning the surface 32 of the object 34 by manually moving the scanner 20. The three-dimensional coordinates are determined and acquired in block 198. In query block 200, it is determined if an anomaly is present in the coordinate data or if improved accuracy is needed. As discussed above, anomalies may occur for a number of reasons such as multipath interference, surface reflectance changes or a low resolution of a feature. If an anomaly is present, the process proceeds to block 202 where the area 204 is indicated to the operator. The area 204 may be indicated by projecting a visible light 192 with the projector 188 onto the surface 32 or it may be indicated by another means such as presenting a marked region on a CAD model shown in a display in an external computer, display built into the scanner body, or a handheld display. In one embodiment, the light 192 is colored to notify the operator of the type of anomaly detected.

The operator then proceeds to move the scanner from a first position to a second position (indicated by the dashed lines) in block 206. In the second position, the sensor 194 contacts the surface 32. The position and orientation (six degrees of freedom) of the scanner 20 in the second position may be determined using well known best-fit methods based on images acquired by the camera 190. Since the dimensions and arrangement of the probe 194 are known in relation to the mechanical structure of the scanner 20, the three-dimensional coordinate data of the points in area 204 may be determined in block 208. The process then proceeds to block 210 where scanning of the object continues. The scanning process continues until the desired area has been scanned.

A general approach may be used to evaluate not only multipath interference but also quality in general, including resolution and effect of material type, surface quality, and geometry. Referring also to FIG. 12, in an embodiment, a method 4600 may be carried out automatically under computer control. A step 4602 is to determine whether information on three-dimensional coordinates of an object under test are available. A first type of three-dimensional information is CAD data. CAD data usually indicates nominal dimensions of an object under test. A second type of three-dimensional information is measured three-dimensional data—for example, data previously measured with a scanner or other device. In some cases, the step 4602 may include a further step of aligning the frame of reference of the coordinate measurement device, for example, laser tracker or six-DOF scanner accessory, with the frame of reference of the object. In an embodiment, this is done by measuring at least three points on the surface of the object with the laser tracker.

If the answer to the question posed in step 4602 is that the three-dimensional information is available, then, in a step 4604, the computer or processor is used to calculate the susceptibility of the object measurement to multipath interference. In an embodiment, this is done by projecting each ray of light emitted by the scanner projector, and calculating the angle or reflection for each case. The computer or software identifies each region of the object surface that is susceptible to error as a result of multipath interference. The step 4604 may also carry out an analysis of the susceptibility to multipath error for a variety of positions of the six-DOF probe relative to the object under test. In some cases, multipath interference may be avoided or minimized by selecting a suitable position and orientation of the six-DOF probe relative to the object under test, as described hereinabove. If the answer to the question posed in step 4602 is that three-dimensional information is not available, then a step 4606 is to measure the three-dimensional coordinates of the object surface using any desired or preferred measurement method. Following the calculation of multipath interference, a step 4608 may be carried out to evaluate other aspects of expected scan quality. One such quality factor is whether the resolution of the scan is sufficient for the features of the object under test. For example, if the resolution of a device is 3 mm, and there are sub-millimeter features for which valid scan data is desired, then these problem regions of the object should be noted for later corrective action. Another quality factor related partly to resolution is the ability to measure edges of the object and edges of holes. Knowledge of scanner performance will enable a determination of whether the scanner resolution is good enough for given edges. Another quality factor is the amount of light expected to be returned from a given feature. Little if any light may be expected to be returned to the scanner from inside a small hole, for example, or from a glancing angle. Also, little light may be expected to be reflected from certain kinds and colors of materials. Certain types of materials may have a large depth of penetration for the light from the scanner, and in this case good measurement results would not be expected. In some cases, an automatic program may ask for user supplementary information. For example, if a computer program is carrying out steps 4604 and 4608 based on CAD data, it may not know the type of material being used or the surface characteristics of the object under test. In these cases, the step 4608 may include a further step of obtaining material characteristics for the object under test.

Following the analysis of steps 4604 and 4608, the step 4610 is to decide whether further diagnostic procedures should be carried out. A first example of a possible diagnostic procedure is the step 4612 of projecting a stripe at a preferred angle to note whether multipath interference is observed. The general indications of multipath interference for a projected line stripe were discussed hereinabove with reference to FIG. 5. Another example of a diagnostic step is step 4614, which is to project a collection of lines aligned in the direction of epipolar lines on the source pattern of light, for example, the source pattern of light 30 from projector 36 in FIG. 1. For the case in which lines of light in the source pattern of light are aligned to the epipolar lines, then these lines will also appear as straight lines in the image plane on the photosensitive array. The use of epipolar lines is discussed in more detail in commonly owned U.S. patent application Ser. No. 13/443,946 filed Apr. 11, 2012 the contents of which are incorporated by reference herein. If these patterns on the photosensitive array are not straight lines or if the lines are blurred or noisy, then a problem is indicated, possibly as a result of multipath interference.

The step 4616 is to select a combination of preferred actions based on the analyses and diagnostic procedure performed. If speed in a measurement is particularly important, a step 4618 of measuring using a 2D (structured) pattern of coded light may be preferred. If greater accuracy is more important, then a step 4620 of measuring using a 2D (structured) pattern of coded light using sequential patterns, for example, a sequence of sinusoidal patterns of varying phase and pitch, may be preferred. If the method 4618 or 4620 is selected, then it may be desirable to also select a step 4628, which is to reposition the scanner, in other words to adjust the position and orientation of the scanner to the position that minimizes multipath interference and specular reflections (glints) as provided by the analysis of step 4604. Such indications may be provided to a user by illuminating problem regions with light from the scanner projector or by displaying such regions on a monitor display. Alternatively, the next steps in the measurement procedure may be automatically selected by a computer or processor. If the preferred scanner position does not eliminate multipath interference and glints, several options are available. In some cases, the measurement can be repeated with the scanner repositioned and the valid measurement results combined. In other cases, alternative measurement steps may be added to the procedure or performed instead of using structured light. As discussed previously, a step 4622 of scanning a stripe of light provides a convenient way of obtaining information over an area with reduced chance of having a problem from multipath interference. A step 4624 of sweeping a small spot of light over a region of interest further reduces the chance of problems from multipath interference. A step of measuring a region of an object surface with a tactile probe eliminates the possibility of multipath interference. A tactile probe provides a known resolution based on the size of the probe tip, and it eliminates issues with low reflectance of light or large optical penetration depth, which might be found in some objects under test.

In most cases, the quality of the data collected in a combination of the steps 4618-4628 may be evaluated in a step 4630 based on the data obtained from the measurements, combined with the results of the analyses carried out previously. If the quality is found to be acceptable in a step 4632, the measurement is completed at a step 4634. Otherwise, the analysis resumes at the step 4604. In some cases, the 3D information may not have been as accurate as desired. In this case, repeating some of the earlier steps may be helpful.

Referring now to FIGS. 13-17, another embodiment is shown of a system 400 and method of measuring the object 34 using an inspection plan. The system 400 includes a scanner 20, such as the one described above for example, that includes a first projector 402 configured to emit a structured light 406 having at least three non-collinear elements. The scanner 20 further includes an image sensor 404 arranged in a fixed relationship to the first projector 402 to receive the structured light 408 emitted by the first projector 402 and reflected off of a surface, such as object 34 for example. The scanner 20 further includes a second projector 412 configured to emit a visible light, such as a laser light for example, onto the surface of the object 34. In one embodiment, the scanner 20 is held in a fixed location by a frame or fixture 150. It should be appreciated that in some embodiments, the image sensor 404 may be comprised of at least two image sensors, each sensor having a different field of view as described herein above.

The scanner includes a controller having a processor 410 that is configured to determine the three dimensional coordinates of points on the surfaces of object 34. The processor 410 is coupled for communication via a wire or wireless medium 414 to a processing device, such as remote computer system 416 for example. The computer system 116 is operational with numerous other general purpose or special purpose computing system environments or configurations. Examples of well-known computing systems, environments, and/or configurations that may be suitable for use with computer system 416 include, but are not limited to, personal computer systems, server computer systems, thin clients, thick clients, cellular telephones, handheld or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system 416 may be described in the general context of computer system-executable instructions, such as program modules, being executed by the computer system 416. Generally, program modules may include routines, programs, objects, components, logic, data structures, and so on that perform particular tasks or implement particular abstract data types. Computer system 416 may be practiced in distributed cloud computing environments where tasks are performed by remote processing devices that are linked through a communications network. In a distributed computing environment, program modules may be located in both local and remote computer system storage media including memory storage devices. In some embodiments, some of the tasks may be performed by the computer system 416, while other tasks are performed by the processor 410.

Figure 16:
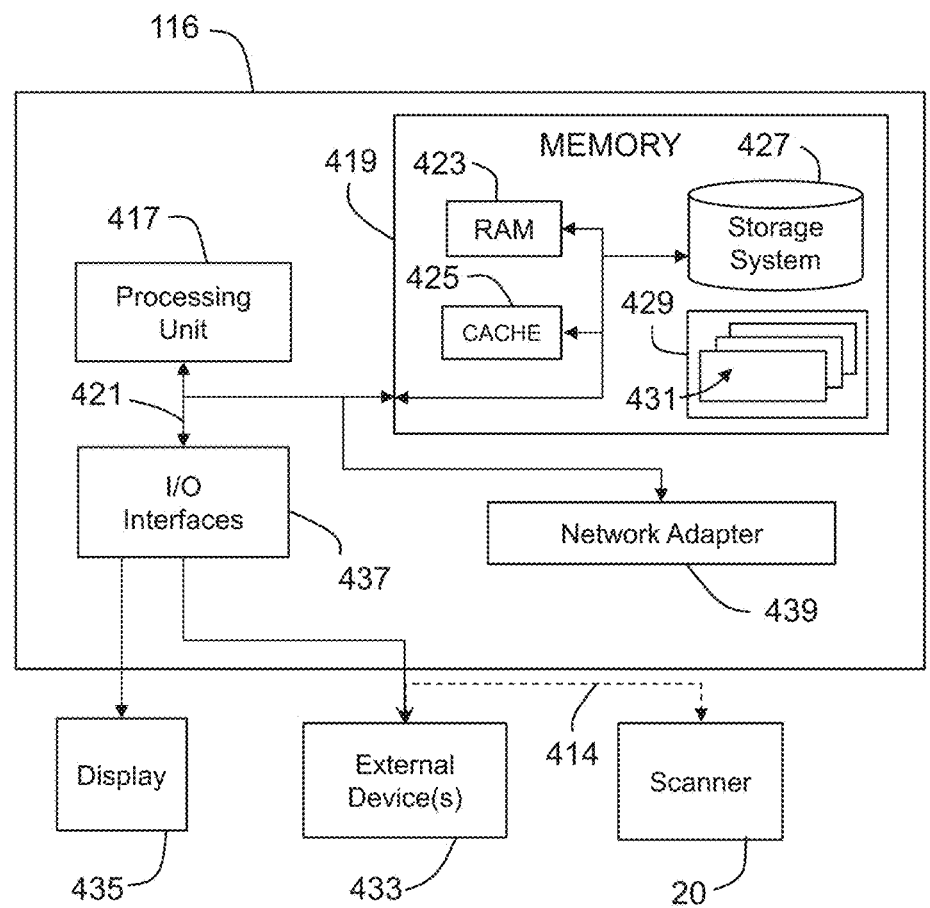
FIG. 16 is a schematic diagram of a computer system for use with the system of FIG. 13.

As shown in FIG. 16, computer system 416 is shown in the form of a general-purpose computing device, also referred to as a processing device. The components of computer system may include, but are not limited to, one or more processors or processing units 417, a system memory 419, and a bus 421 that couples various system components including system memory 419 to processor 417.

Bus 421 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Computer system 416 may include a variety of computer system readable media. Such media may be any available media that is accessible by computer system/server 416, and it includes both volatile and non-volatile media, removable and non-removable media.

System memory 419 can include computer system readable media in the form of volatile memory, such as random access memory (RAM) 423 and/or cache memory 425. Computer system 416 may further include other removable/non-removable, volatile/non-volatile computer system storage media. By way of example only, storage system 427 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 421 by one or more data media interfaces. As will be further depicted and described below, memory 419 may include at least one program product having a set (e.g., at least one) of program modules, such as portions of the method 500 disclosed below, that are configured to carry out the functions of embodiments of the disclosure.

Program/utility 429, having a set (at least one) of program modules 431, may be stored in memory 419 by way of example, and not limitation, as well as an operating system, one or more application programs, other program modules, and program data. Each of the operating system, one or more application programs, other program modules, and program data or some combination thereof, may include an implementation of a networking environment. Program modules 431 generally carry out the functions and/or methodologies of embodiments of the invention as described herein.

Computer system 416 may also communicate with one or more external devices 433 such as a keyboard, a pointing device, a bar code reader, a display 435, etc.; one or more devices, such as scanner 20 for example, that enable a user to interact with computer system/server 416; and/or any devices (e.g., network card, modem, etc.) that enable computer system/server 416 to communicate with one or more other computing devices. Such communication can occur via Input/Output (I/O) interfaces 437. Still yet, computer system 416 can communicate with one or more networks such as a local area network (LAN), a general wide area network (WAN), and/or a public network (e.g., the Internet) via network adapter 439. As depicted, network adapter 439 communicates with the other components of computer system 416 via bus 421. It should be understood that although not shown, other hardware and/or software components could be used in conjunction with computer system 416. Examples include, but are not limited to: microcode, device drivers, redundant processing units, external disk drive arrays, RAID systems, tape drives, and data archival storage systems, etc.

The computer system 416 includes a program module 431 that is configured to receive and manipulate computer aided design model (CAD) data 418 (FIG. 14) and point cloud data 420 from the scanner 20 that includes the measured three dimensional coordinates of points on the surfaces of object 34. The data 418, 420 may be presented to the operator on a user interface 437 of display 435 It should be appreciated that the point cloud data 420 may be comprised of thousands or in some cases millions of data points. The representation of the point cloud data in FIG. 14 has been simplified for clarify and in embodiments, the point cloud data would include points that substantially cover the surfaces of CAD model 418. The computer 416 is further configured to automatically map the point cloud data of object 34 onto a CAD model of object 34. As used herein, the term "map," "mapped" or "mapping" refers to a process of aligning and orienting the point cloud data and the CAD model such that the data sets overlay each other in three dimensional space. It should be appreciated that due to manufacturing tolerances and measurement errors, the point cloud data will typically not completely overlap with the CAD model. In one embodiment, the mapping process uses a best fit method. In other embodiments, the user interface 437 may be configured to allow the operator to make manual adjustments of the mapping to improve or achieve a desired fit between the point cloud data and the CAD model.

Once the point cloud data is mapped onto the CAD model, data points, such as data points 420 for example, within the point cloud data may be associated with features, such as hole 422 for example in the CAD model 418 for example. It should be appreciated that the operator may be interested in some features, such as the diameter of hole 422 for example, and desire measurements of these features to a higher level of accuracy than may be initially obtained by the scanner 20 alone, especially when the point cloud data is rapidly acquired using the image sensor with a wide field of view. Further, in some embodiments, the scanner 20 may not provide a desired resolution of certain areas of object 34 such as the edges of holes or corners of surfaces for example. Still further, the scanner 20 may not obtain point data in areas that are shadowed from the projector 402 or image sensor 404.

As will be discussed in more detail below, to obtain three dimensional coordinates of points in these circumstances, the computer system 416 identifies the features of interest on the mapped CAD model/point cloud data set. Since the features on the CAD model 418 may be correlated to sets of points in the point cloud data 420, the location of the features on the object 34 (in real space) may be determined. To assist the operator in locating these features, the second projector 412 may be used to project a light 424 onto the object 34 proximate the desired feature. In one embodiment, the computer 416 determines the features where additional measurements are needed from an inspection plan associated with object 34. In one embodiment, the object 34 may include a bar code or other machine readable symbol that allows the computer 416 to automatically retrieve the correct CAD model and inspection plan from storage in response to the operator scanning the machine readable symbol.

In one embodiment, to acquire additional coordinate data of features, the operator uses a remote probe 152. As discussed above, the remote probe 152 includes at least three non-collinear points of light 168. The points of light 168 may be spots of light produced, for example, by light emitting diodes (LED) or retroreflective dots of light illuminated by infrared or visible light source from the projector 156 or from another light source not depicted in FIG. 15. The infrared or visible light source in this case may be attached to the scanner 20 or may be placed external to the scanner 20. By determining the three-dimensional coordinates of the spots of light 168 with the scanner 20 using photogrammetry techniques and by using information on the geometry of the probe 152, the position of the probe tip 166 may be determined, thereby enabling the coordinates of the desired feature to be determined.

In some embodiments, the functionality of the of the computer system 416 is incorporated into the scanner 20 to provide an integrated device for both scanning, mapping and defining of an inspection plan.

Figure 17:
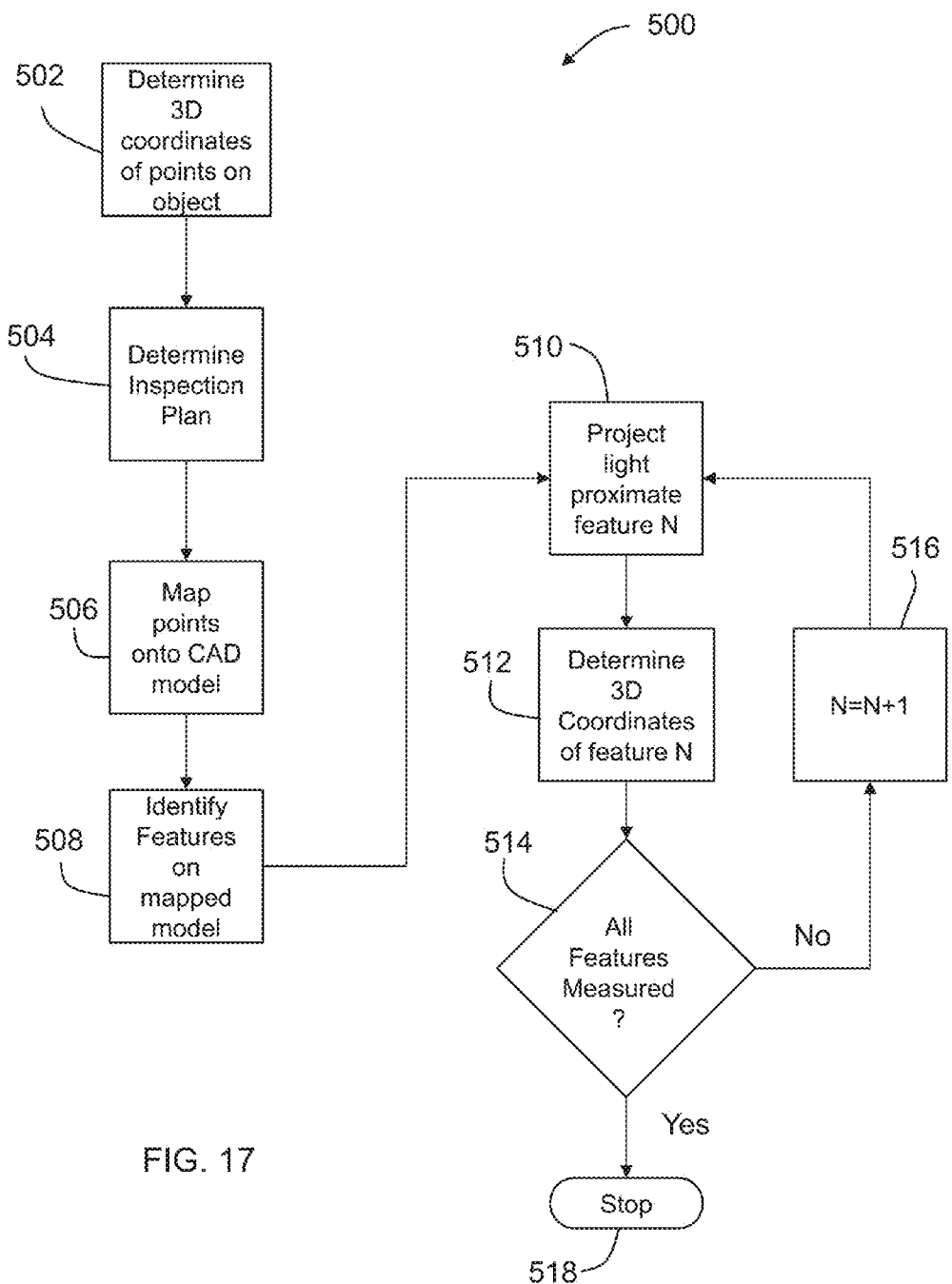
FIG. 17 is a flow diagram of a method of scanning and performing an inspection plan in accordance with an embodiment of the invention.

Referring now to FIG. 17, one embodiment of a method 500 is shown for measuring an object according to an inspection plan using a scanner 20. The method 500 begins in block 502 where the three dimensional coordinates of points on the object 34 are acquired using scanner 20. In one embodiment, the three dimensional coordinate data is acquired using an image sensor having a wide field of view, which allows for rapid acquisition of three dimensional coordinate data of the object 34. The process 500 then proceeds to block 504 where the inspection plan for the object 34 is determined. The inspection plan data may include data related to features interest where additional data may be desired and an order in which to acquire the additional three dimensional coordinate data. In one embodiment, the inspection plan data is automatically retrieved from storage 427 when the operator scans a machine readable symbol, such as a bar code for example, that is associated with the object 34.

The method 500 then proceeds to block 506 where the three dimensional coordinate data acquired by scanner 20 is imported into the computer 416 via medium 414 and mapped onto a CAD model of the object 34. The method 500 then proceeds to block 508 where the features (e.g. hole 422) on the mapped CAD model are correlated with points in the three dimensional coordinate data. The method 500 then further identifies which of the features correspond to features of interest in the inspection plan. The method 500 then proceeds to block 510 where the location data of the features of interest are transmitted to the scanner via medium 414. The location data may be in the form of coordinate data or the identification of one or more points in the point cloud. The scanner 20 illuminates the second projector 412 to project a light onto the object 34 proximate the first feature of interest, such as hole 422 for example. The operator then uses the remote probe 152 in block 512 to acquire additional coordinate data of points associated with the feature of interest. For example, the diameter of the hole 422 may be of interest to the operator and the operator may contact the sensor 166 in multiple locations about the inside surface of the hole 422. In one embodiment, the type of measurement that is needed for a feature may be indicated to the operator by projecting a symbol with the second projector 412, such as with a swept point of light for example.

With the data for the first feature acquired, the method 500 proceeds to query block 514 where it is determined if all the features of interest have been measured. If query block 514 turns a negative, the method 500 proceeds to block 516 where the next feature of interest is determined and the method 500 loops back to block 510, where the projected visible light is moved from the present feature to the next feature. If the query block 514 returns a positive, then all of the features of interest have been measured and the method 500 terminates in block 518. It should be appreciated that while the method 500 is illustrated as a linear process, some of the steps may be performed in parallel or the order of the steps may be rearranged. For example, the acquisition of the three dimensional coordinate data in block 502 may be performed in parallel with the determination of the inspection plan in block 504, or the order may be reversed. It should still further be appreciated that some of the steps, such as block 502 and blocks 510-514 for example, may be performed by the scanner 20, while other steps, such as blocks 504-508 for example, may be performed by the computer system 416.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

The invention claimed is:

1. A method of determining three dimensional coordinates of an object, the method comprising: determining a first set of three dimensional coordinates for a plurality of points on the object with a scanner device, the scanner device being configured to emit and receive a structured light for determining the first set of three dimensional coordinates of points on a surface; accessing with a processor an inspection plan for the object, the inspection plan including a plurality of features to be inspected with a remote probe; mapping with the processor the plurality of points onto a computer aided design model; associating with the processor the plurality of features with the plurality of points mapped onto a computer aided design model; projecting a visible light with the scanner device proximate a first feature of the plurality of features; directly contacting a probe tip on the remote probe to at least one first point on the first feature on the object; determining a first position and orientation of the remote probe with the scanner device, the remote probe having a plurality of illuminated lights, the plurality of illuminated lights haring at least three non-collinear and non-coplanar illuminated lights; and determining with the scanner device a second set of three dimensional coordinates of the at least one first point on the first feature on the object;
    scanning a machine readable symbol with the scanner device and automatically retrieving the inspection plan from memory based at least in part on the machine readable symbol.

2. The method of claim 1 wherein the inspection plan includes an order to inspect the plurality of features, the first feature of the plurality of features corresponding to a first feature to be inspected, a second feature of the plurality of features corresponding to a second feature to be inspected.

3. The method of claim 2 further comprising moving the projected light from the first feature to the second feature in response to determining the second set of three dimensional coordinates.

4. The method of claim 3 further comprising: contacting the sensor on the remote probe to at least on second point on the second feature on the object; determining with the scanner device a second position and orientation of the remote probe with the scanner device; and determining with the scanner device a third set of three dimensional coordinates of the at least one second point on the second feature on the object.

5. The method of claim 4 wherein the scanner device includes a projector having a light source, the projector configured to emit the structured light, the structured light including at least three non-collinear pattern elements, the scanning device further having an image sensor arranged to receive the structured light reflected from the surface.

6. The method of claim 5 wherein the step of determining the first set of three dimensional coordinates includes emitting a first structured light with the projector onto the object and receiving reflected first structured light from the object with the image sensor.

7. The method of claim 6 wherein the step of determining a first position and orientation of the remote probe includes emitting a second structured light onto the plurality of illuminated lights and receiving the second structured light reflected off of the plurality of illuminated lights with the image sensor.

8. The method of claim 1 wherein the plurality of illuminated lights are retroreflective targets.

9. A method of determining three dimensional coordinates of an object, the method comprising: providing a scanning device having a projector having a light source, the projector configured to emit a structured light onto the object, the structured light including at least three non-collinear pattern elements, the scanning device further having an image sensor arranged to receive the structured light reflected from the object; providing a movable remote probe having a touch sensor on one end and a plurality of illuminated lights disposed thereon, the plurality of illuminated lights having at least three non-collinear and non-coplanar illuminated lights, the remote probe being configured to transmit a signal in response to the touch sensor directly contacting the object; projecting a first structured light onto the object with the projector; receiving the first structured light reflected from the object with the image sensor; determining with the scanning device a first set of three dimensional coordinates from the first structured light reflected from the object; mapping with a processor the first set of three dimensional coordinates onto a computer aided design model of the object; associating at least one feature of the object with the first set of three dimensional coordinates mapped onto the computer aided design model of the object; retrieving with the processor an inspection plan for the object, the inspection plan including the at least one feature, wherein the step of associating the at least one feature includes determining the feature from the inspection plan; and projecting the visible light onto the object proximate a location of the at least one feature with the projector;

scanning a machine readable symbol with the scanner device and automatically retrieving the inspection plan from memory based at least in part on the machine readable symbol.

10. The method of claim 9 further comprising: contacting, the touch sensor to at least one point on the at least one feature; determining a position and orientation of the remote probe in response to receiving a second light with the image sensor that is projected by the projector and reflected from the plurality of illuminated lights; determining a second set of three dimensional coordinates for the at least one point from the position and orientation of the remote probe.

11. The method of claim 10 wherein the inspection plan includes a plurality of features and an order of inspection.

12. The method of claim 11 wherein the step of associating with the processor the at least one feature includes associating the plurality of features with the first set of three dimensional coordinates mapped onto the computer aided design model of the object.

13. The method of claim 12 further comprising projecting the light onto the object proximate each of the plurality of features, the visible light being projected to each of the plurality of features in the order of the inspection plan.

14. The method of claim 13 further comprising: contacting the touch sensor to at least one second point on each of the plurality of features; determining a second position and orientation of the remote probe in response to the touch sensor contacting the at least one second point and receiving a third structured light with the image sensor that is projected by the projector and reflected from the plurality of illuminated lights; and determining a third set of three dimensional coordinates for the at least one second point from the second position and orientation of the remote probe.

15. The method of claim 14 wherein the light moves to a next one of the plurality of features in response to determining the third set of three dimensional coordinates.

16. The method of claim 14 wherein the plurality of illuminated lights are retroreflective targets.

17. A noncontact optical three-dimensional measuring device comprising:

a projector having a light source, the projector configured to emit a structured light onto an object, the structured light including at least three non-collinear pattern elements;

an image sensor arranged in a fixed relationship with the projector and arranged to receive the structured light reflected from the object;

a movable remote probe having a touch sensor on one end and a plurality of illuminated lights disposed thereon, the plurality of illuminated lights having at least three non-collinear and non-coplanar illuminated lights, the remote probe being configured to transmit a signal in response to the touch sensor directly contacting the object, wherein the image sensor is further arranged to receive light reflected from the plurality of illuminated lights;

a processor having memory, the processor being electrically coupled to the projector and the image sensor, the processor is configured to access an inspection plan from the memory, the processor further being configured to project a second light with the projector and receive the second light reflected off of the object with the image sensor, the processor further configured to determining a first set of three dimensional coordinates of points on the object based at least in part on the second light being received by the image sensor;

and a processing device coupled for communication to the processor, the processing device being configured to receive a computer aided design model of the object and the first set of three dimensional coordinates, the processing device being configured to map the first set of three dimensional coordinates onto the computer aided design model in response to receiving the first set of three dimensional coordinates;

scanning a machine readable symbol with the scanner device and automatically retrieving the inspection plan from memory based at least in part on the machine readable symbol.

18. The device of claim 17 wherein the processing device is configured to determine a feature on the object and transmit a signal to the processor, the signal indicating the location of the feature on the object.

19. The device of claim 18 wherein the processor projects a visible light proximate the feature in response to receiving the signal.

20. The device of claim 19 wherein the processing device is configured to receive an inspection data set for the object, the inspection data set including data on the feature.

21. The device of claim 20 wherein the processor is further configured to project a visible light proximate a feature on the object, the processor further being responsive to determining a position and orientation of the remote probe in response to receiving a first light with the image sensor that is projected by the first projector and reflected from the plurality of illuminated lights to determine a second set of three-dimensional coordinates of points for the feature.

22. The method of claim 17 wherein the plurality of illuminated lights are retroreflective targets.

\* \* \* \* \*